US006669796B2

(12) United States Patent
Tokuda et al.

(10) Patent No.: US 6,669,796 B2
(45) Date of Patent: Dec. 30, 2003

(54) METHOD OF MANUFACTURING LAMINATED CERAMIC ELECTRONIC COMPONENT, AND LAMINATED CERAMIC ELECTRONIC COMPONENT

(75) Inventors: Hiromichi Tokuda, Omihachiman (JP); Takashi Tomohiro, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/037,202

(22) Filed: Nov. 9, 2001

(65) Prior Publication Data

US 2002/0105052 A1 Aug. 8, 2002

(30) Foreign Application Priority Data

Nov. 9, 2000 (JP) ....................................... 2000-342220

(51) Int. Cl.$^{7}$ .......................... B32B 31/26; H01L 21/44

(52) U.S. Cl. ................................ 156/89.12; 156/89.16; 156/235; 156/246

(58) Field of Search ........................... 156/89.12, 89.16, 156/230, 235, 246; 427/96, 97, 126.1, 126.2, 126.3, 126.4, 126.5, 126.6

(56) References Cited

U.S. PATENT DOCUMENTS

| | | | | |
|---|---|---|---|---|
| 5,250,923 A | * | 10/1993 | Ushiro et al. |
| 5,271,150 A | * | 12/1993 | Inasaka |
| 5,349,743 A | * | 9/1994 | Grader et al. |
| 5,850,682 A | * | 12/1998 | Ushiro |
| 2002/0105788 A1 | * | 8/2002 | Tokuda et al. |

FOREIGN PATENT DOCUMENTS

| | | | |
|---|---|---|---|
| JP | 56-155516 | | 12/1981 |
| JP | 1-226131 | * | 9/1989 |
| JP | 5-190367 | * | 7/1993 |
| JP | 6-045307 | | 6/1994 |
| JP | 7-045461 A | | 2/1995 |
| JP | 8-186047 A | | 7/1996 |
| JP | 2000-21637 | * | 1/2000 |
| JP | 2000-260621 | * | 9/2000 |

* cited by examiner

*Primary Examiner*—Curtis Mayes
(74) *Attorney, Agent, or Firm*—Keating & Bennett, LLP

(57) ABSTRACT

In a method for manufacturing a laminated ceramic electronic component, a first transfer member and a second transfer member are prepared on a lamination stage to produce the laminated ceramic electronic component. The first transfer member includes a conductor-attached composite green sheet having a conductor on a portion of the surface thereof, including a non-magnetic ceramic region and a magnetic ceramic region, and a first carrier film that carries the conductor-attached composite green sheet. The second transfer member includes a ceramic green sheet and a carrier film that carries the ceramic green sheet. The laminated ceramic electronic component is thus produced through a first transfer step in which the ceramic green sheets are successively transferred, through a second transfer step in which the conductor-attached composite green sheet is transferred, and through a third transfer step in which the ceramic green sheet of the second transfer member is transferred. A desired conductor and a structure within a sintered ceramic body are produced with high accuracy, and the manufacturing process is greatly simplified, and costs of the laminated ceramic electronic component are greatly reduced.

11 Claims, 24 Drawing Sheets

METHOD OF MANUFACTURING LAMINATED CERAMIC ELECTRONIC COMPONENT, AND LAMINATED CERAMIC ELECTRONIC COMPONENT

BACKGROUND OF THE INVENTION

1. Field of the Invention

The present invention is directed to a method for manufacturing a laminated ceramic electronic component such as a laminated inductor or laminated common-mode choke coil and, more particularly, to a method for manufacturing a laminated ceramic electronic component in which a lamination step is performed using a transfer technique, and a laminated ceramic electronic component that is manufactured by this manufacturing method.

2. Description of the Related Art

Conventional miniaturized inductor components are monolithic coils that are produced using a monolithic ceramic sintering technique. For example, Japanese Unexamined Patent Application Publication No. 56-155516 discloses an open magnetic circuit type monolithic coil as a monolithic inductor. According to the disclosure of this Japanese Application, a magnetic ceramic paste is printed a plurality of times, thereby producing a bottom external layer. A conductor forming a portion of coil, and a magnetic paste are alternately printed. A coil conductor is produced in this way. In the course of printing the coil conductor, a non-magnetic paste is also printed. After the coil conductor is printed, a magnetic paste is printed a plurality of times to form a top external layer. A laminate structure thus produced is pressed in the direction of thickness, and is then sintered. An open magnetic circuit type monolithic coil is thus produced.

In the above-described method of manufacturing the open magnetic circuit type monolithic coil, the laminate structure is obtained by printing the magnetic paste, the non-magnetic paste, and an electrically conductive paste for lamination. In such a lamination-by-printing method, a layer is printed on an already printed layer. The height of a portion where a conductor is printed to form the coil conductor is different from the height of the remaining portion, and the flatness of the printed underlayer is not sufficient. For this reason, the magnetic paste, the non-magnetic paste, or the conductive paste tends to run when they are printed, and a desired monolithic coil cannot be produced with high accuracy.

In the lamination-by-printing method, the magnetic paste, the non-magnetic paste, and the electrically conductive paste used therein in the respective steps require sufficient contact and closeness with the underlayer thereof, and the number of usable types of paste is limited.

In the lamination-by-printing method, an already printed paste needs to be dried to some degree prior to the printing of the next paste. The printing process thus requires much time, and involves complex steps, thereby making it very difficult to reduce the costs of the monolithic coil.

SUMMARY OF THE INVENTION

In order to overcome the problems described above, preferred embodiments of the present invention provide a reliable, low-cost and simple-structured, laminated ceramic electronic component, and method of manufacturing the same, which allows a desired conductor and a sintered ceramic internal structure to be produced with high accuracy.

According to a preferred embodiment of the present invention, a method for manufacturing a laminated ceramic electronic component includes the steps of preparing a first transfer member which includes a conductor-attached composite green sheet and a first carrier film supporting the composite green sheet, the composite ceramic green sheet, including a first ceramic region and a second ceramic region made of a ceramic that is different from a ceramic of the first ceramic region, having a conductor on one surface thereof, preparing a second transfer member which includes a ceramic green sheet and a second carrier film supporting the ceramic green sheet, a first transfer step of transferring the ceramic green sheet of at least one second transfer member on a lamination stage, a second transfer step of transferring the conductor-attached composite green sheet of at least one first transfer member to at least one ceramic green sheet already laminated, a third transfer step of transferring the ceramic green sheet of at least one second transfer member to the conductor-attached composite green sheet already laminated, and sintering a laminated body obtained from the first transfer step through the third transfer step.

In another preferred embodiment of the present invention, a method for manufacturing a laminated ceramic electronic component further includes the step of preparing a plurality of first transfer members, and forming a via hole electrode in the composite ceramic green sheet of the conductor-attached composite green sheet of at least one first transfer member so that the conductors are connected among a plurality of conductor-attached composite green sheets subsequent to lamination.

In another preferred embodiment of the present invention, a plurality of conductors are connected through the via hole electrodes to form a coil conductor when the plurality of conductor-attached composite green sheets are laminated.

It is preferable that the first ceramic region is made of a magnetic ceramic, and the second ceramic region is made of a non-magnetic ceramic.

Also, it is preferable that the ceramic sheet of the second transfer member is made of a magnetic ceramic.

The conductor is preferably formed on the top surface of the composite green sheet in the first transfer member.

The conductor is preferably formed on the bottom surface of the composite green sheet in the first transfer member.

The method for manufacturing a laminated ceramic electronic component preferably includes the step of forming the first ceramic region by printing a magnetic ceramic paste and the second ceramic region by printing a non-magnetic ceramic paste.

In a further preferred embodiment of the present invention, the method for manufacturing a laminated ceramic electronic component includes forming the first and second ceramic regions except a region where a via hole electrode is to be formed, and thereafter filling the region with an electrically conductive paste to form the via hole electrode.

In another preferred embodiment of the present invention, the method for manufacturing a laminated ceramic electronic component includes forming a through hole in which a via hole electrode is to be formed after preparing the composite ceramic green sheet, and filling the through hole with an electrically conductive paste to form the via hole electrode.

The ceramic green sheet of the second transfer member is preferably produced by forming a ceramic green sheet on the second carrier film.

In a further preferred embodiment of the present invention, a method for manufacturing a laminated ceramic electronic component further includes preparing a third transfer member which includes a composite ceramic green sheet including the first ceramic region and the second ceramic region, and a third carrier film supporting the composite ceramic green sheet, and transferring the composite ceramic green sheet from at least one third transfer member between the first transfer step and the third transfer step.

In yet another preferred embodiment of the present invention, a laminated ceramic electronic component includes a sintered ceramic body produced according to the manufacturing method according to preferred embodiments of the present invention described above, a plurality of external electrodes arranged on the external surface of the sintered ceramic body, and respectively electrically connected to conductors within the sintered ceramic body.

Another preferred embodiment of the present invention provides a laminated ceramic electronic component including a sintered ceramic body, at least one coil conductor arranged within the sintered ceramic body and including a coil portion and first and second lead-out portions respectively connected to both ends of the coil portion, a plurality of external electrodes arranged on the external surface of the sintered ceramic body and electrically connected to an end of the first lead-out portion or an end of the second lead-out portion, wherein the sintered ceramic body includes a magnetic ceramic and a non-magnetic ceramic, the coil portion of the coil conductor is coated with a non-magnetic ceramic, and the first and second lead-out portions of the coil conductor are coated with a non-magnetic ceramic.

Other features, elements, characteristics and advantages of the present invention will become more apparent from the following detailed description of preferred embodiments with reference to the attached drawings.

DETAILED DESCRIPTION OF PREFERRED EMBODIMENTS

The present invention will become apparent from the following description of preferred embodiments with reference to the drawings.

Figure 1:
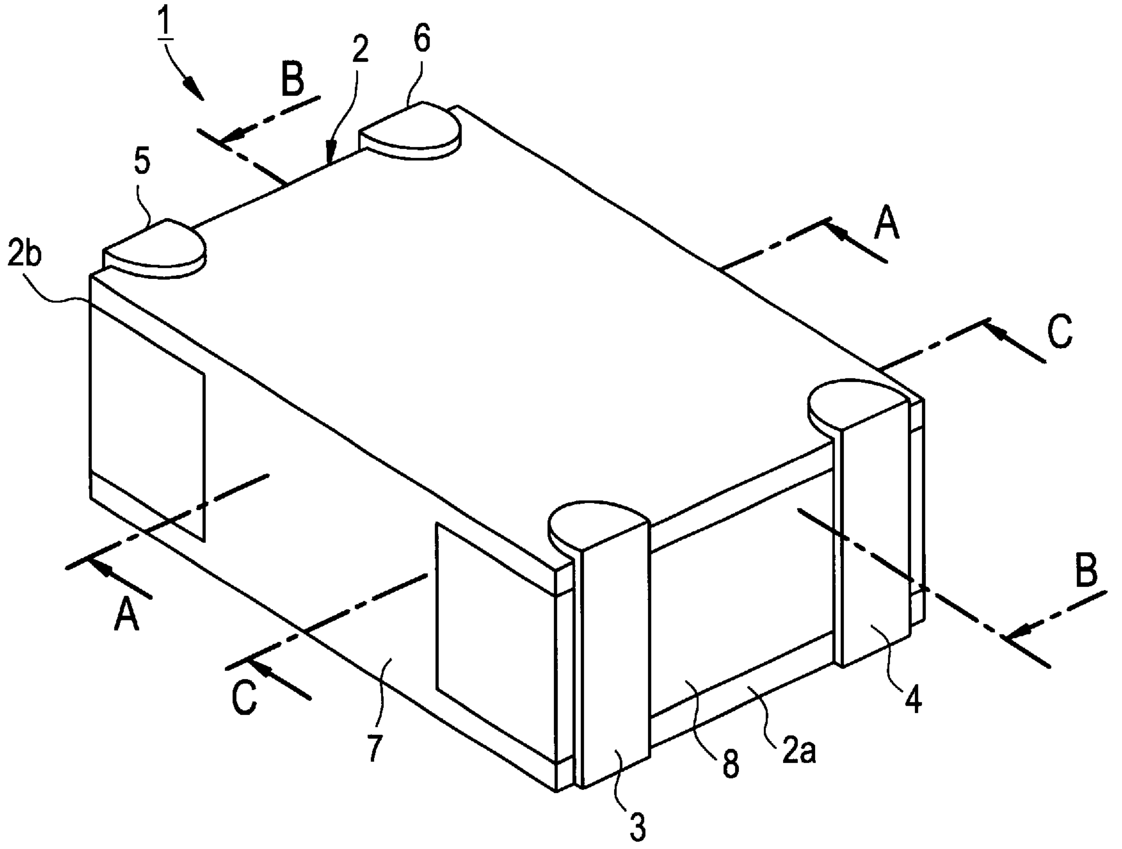
FIG. 1 is a perspective view showing the external appearance of a laminated ceramic electronic component of a first preferred embodiment of the present invention.

FIG. 1 is a perspective view showing the external appearance of a laminated ceramic electronic component 1 of a first preferred embodiment of the present invention. The laminated ceramic electronic component 1 is preferably a closed magnetic circuit type, common-mode monolithic choke coil.

The laminated ceramic electronic component 1 includes a substantially rectangular, sintered ceramic body 2. First and second external electrodes 3 and 4, and third and fourth external electrodes 5 and 6 are disposed on the sintered ceramic body 2. The external electrodes 3 and 4 are provided on one end surface of the sintered ceramic body 2, and the external electrodes 5 and 6 are provided on the other end surface of the sintered ceramic body 2 opposite to the first end surface having the external electrodes 3 and 4.

Figure 2A:
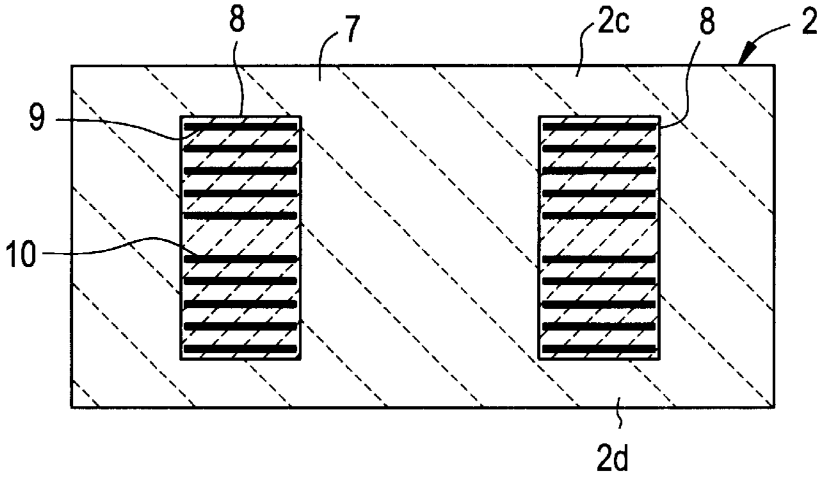
FIGS. 2A–2C are sectional views of the laminated ceramic component, respectively taken along line A—A, line B—B, and line C—C in FIG. 1.
Figure 2B:
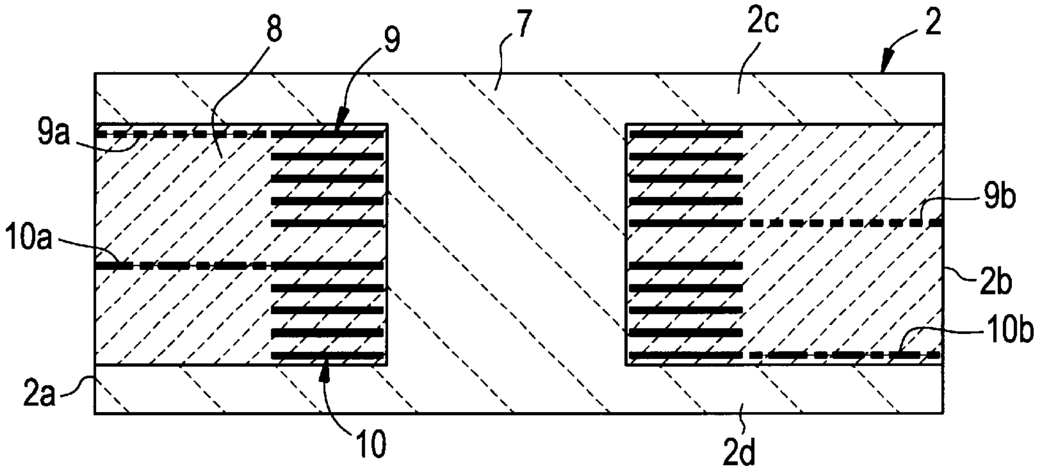
Figure 2C:
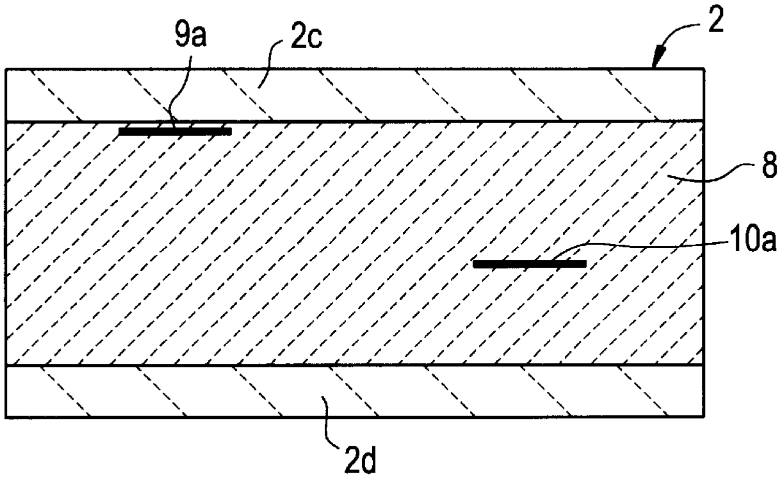

FIG. 2A is a sectional view of the laminated ceramic component, taken along line A—A in FIG. 1, FIG. 2B is a sectional view of the laminated ceramic component, taken along line B—B in FIG. 1, and FIG. 2C is a sectional view of the laminated ceramic component, taken along line C—C in FIG. 1.

The sintered ceramic body 2 includes a magnetic ceramic 7 and a non-magnetic ceramics 8. First and second coils 9 and 10 are disposed within the non-magnetic ceramics 8. The coils 9 and 10 are wound within the sintered ceramic body 2 in the direction of width. A top lead-out portion 9*a* of the coil 9 is routed out to an end surface 2*a* of the sintered ceramic body 2, and a bottom lead-out portion 9*b* of the coil 9 is routed out to an end surface 2*b* of the sintered ceramic body 2. A top lead-out portion 10*a* of the coil 10 is also routed out to the end surface 2*a,* while a bottom lead-out portion 10*b* is routed to the end surface 2*b*.

FIG. 2B shows a section along line B—B in FIG. 1, in which the coil lead-out portions 9*a* and 9*b* are represented by dotted lines. The coil lead-out portions 10*a* and 10*b* are represented by dot-dash chain lines to indicate that the coil lead-out portions 10*a* and 10*b* are not present in the plane of the page of FIG. 2B but actually lie in a section that is parallel to and above the page.

The same is true of FIG. 11B, FIG. 16B, FIG. 18B, FIG. 20B, and FIG. 22B.

The lead-out portions 9*a* and 10*a* of the coils 9 and 10 that are led out to the end surface 2*a* are respectively electrically connected to the external electrodes 3 and 4. On the other hand, the lead-out portions 9*b* and 10*b* of the coils 9 and 10 are respectively electrically connected to the external electrodes 5 and 6 on the end surface 2*b*.

The first coil 9 and the second coil 10 are spaced in the direction of thickness within the sintered ceramic body 2. The coils 9 and 10 disposed within the non-magnetic ceramic 8 are covered with the magnetic ceramic 7 from above and from below.

A method of manufacturing the laminated ceramic electronic component 1 of this preferred embodiment will now be described with reference to FIG. 3A through FIG. 9B.

External layers 2*c* and 2*d* shown in FIGS. 2A–2C are now produced. A carrier film having a substantially rectangular magnetic ceramic green sheet is prepared to form a plurality of second transfer members.

Figure 3A:
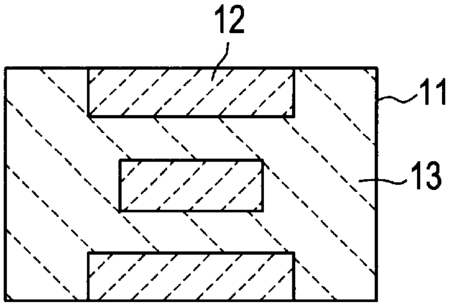
FIGS. 3A–3F are plan views illustrating composite green sheets prepared for the production of the laminated ceramic electronic component of the first preferred embodiment of the present invention.

Sheets shown in FIGS. 3A–3F and FIGS. 4A–4F are prepared to form a section sandwiched between the external layers 2*c* and 2*d.* A composite green sheet 11 shown in FIG. 3A includes a magnetic ceramic region 12 defining a first ceramic region and a non-magnetic ceramic region 13 defining a second ceramic region. Referring to FIG. 3B through FIG. 7C, the magnetic ceramic and the non-magnetic ceramic are distinguished by areas hatched with lines drawn in different directions as shown in FIG. 3A.

Figure 5A:
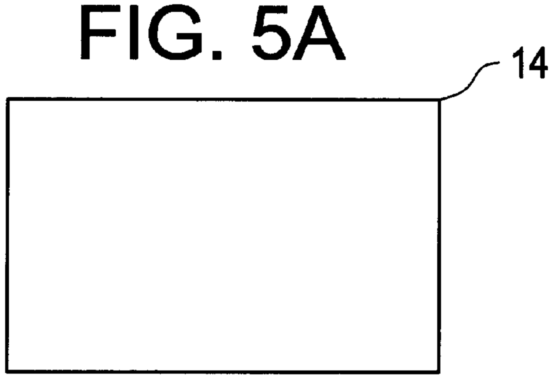
FIGS. 5A–5C are plan views illustrating a manufacturing process for manufacturing the composite green sheet according to the first preferred embodiment of the present invention.
Figure 5B:
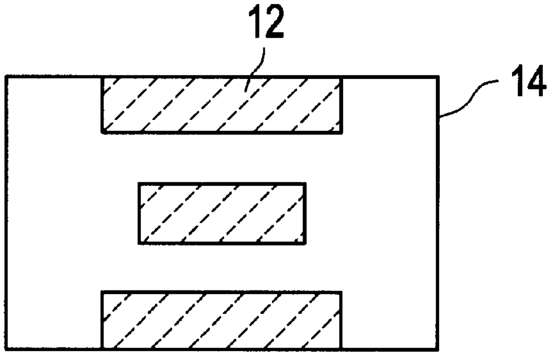

To produce the composite green sheet 11, a carrier film 14 fabricated of a synthetic resin such as polyethylene terephthalate, for example, is prepared as shown in FIG. 5A. A magnetic ceramic paste is printed on the carrier film 14 to form the magnetic ceramic region 12.

Figure 5C:
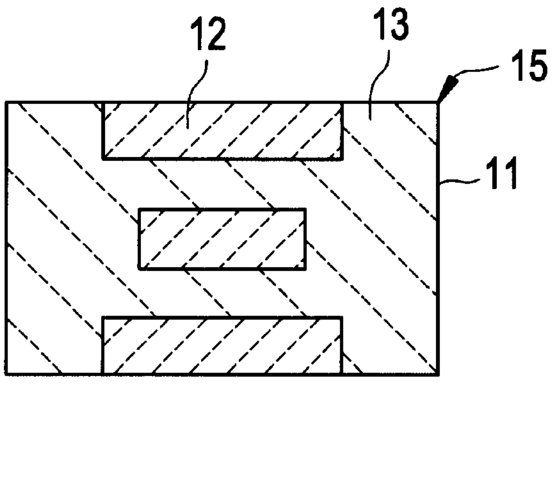

A non-magnetic ceramic paste is then printed on the carrier film 14 on the area other than the formation area of the magnetic ceramic region 12 to form the non-magnetic ceramic region 13 (see FIG. 5C).

In this way, a third transfer member 15 in this preferred embodiment of the present invention is prepared and includes the composite green sheet 11 on the carrier film 14.

Figure 3B:
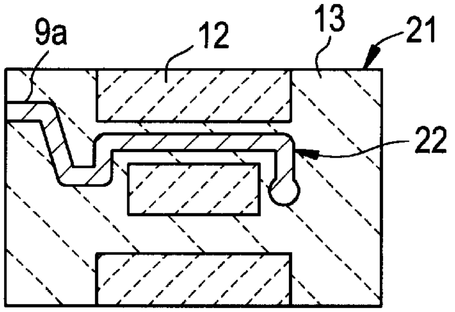

A conductor-attached composite green sheet 21 shown in FIG. 3B is preferably produced in a similar fashion. In the conductor-attached composite green sheet 21, a conductor 22 forming a portion of the coil 9 is produced by printing an electrically conductive paste on the composite green sheet 11. The external end of the conductor 22 defines the top lead-out portion 9*a*.

The method of manufacturing the conductor-attached composite green sheet 21 will now be described, referring to FIGS. 6A–6D.

Figure 6A:
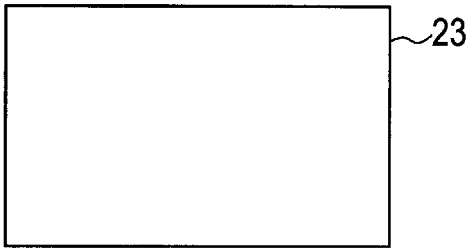
FIGS. 6A–6D are plan views illustrating steps for preparing a first transfer member prepared in the first preferred embodiment of the present invention.
Figure 6B:
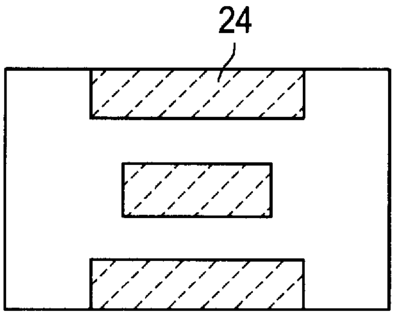
Figure 6C:
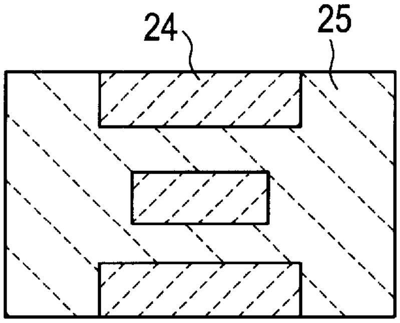

A first carrier film 23 is prepared as shown in FIG. 6A. A magnetic ceramic paste and a non-magnetic ceramic paste are successively printed on the first carrier film 23 to form a magnetic ceramic region 24 and a non-magnetic ceramic region 25. In this way, a composite green sheet is produced. An electrically conductive paste is printed on the top surface of the composite green sheet, specifically on the top surface of the non-magnetic ceramic region 25 to form a conductor 22.

Figure 6D:
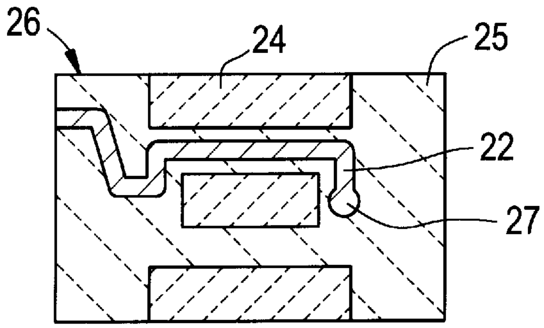

A first transfer member 26 is thus obtained as shown in FIG. 6D.

The conductor 22 has a via hole electrode 27 on the inner end thereof in the first transfer member 26. The via hole electrode 27 is formed by opening a through hole using a laser or through punching, and by printing the conductive paste during the formation of the conductor 22 so that the conductive paste fills the through hole.

Figure 3E:
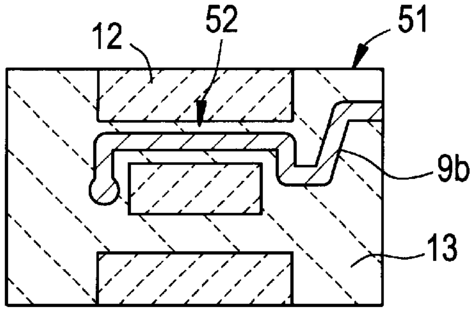
Figure 3C:
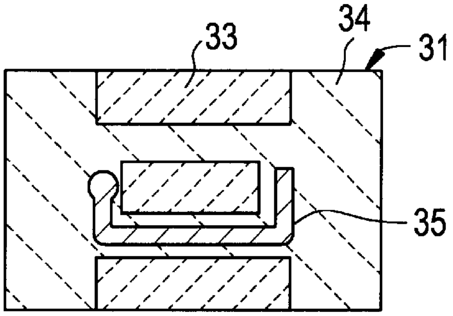
Figure 7A:
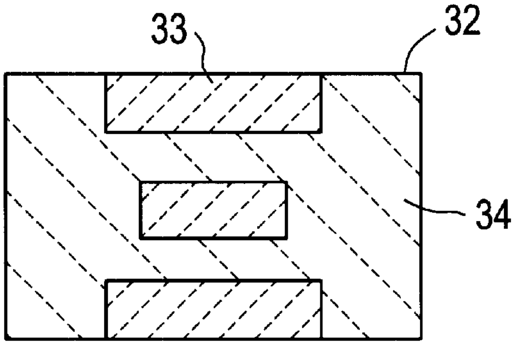
FIGS. 7A–7C are plan views illustrating a manufacturing process for manufacturing a conductor-attached composite green sheet according to the first preferred embodiment of the present invention.

A conductor-attached composite green sheet 31 shown in FIG. 3C is produced in a similar fashion. Referring to FIG. 7A, a composite green sheet 32 is formed on a carrier film (not shown) similar to the composite green sheets 11 and 21. Also shown in FIG. 3C are a magnetic ceramic region 33 and a non-magnetic ceramic region 34.

Figure 7B:
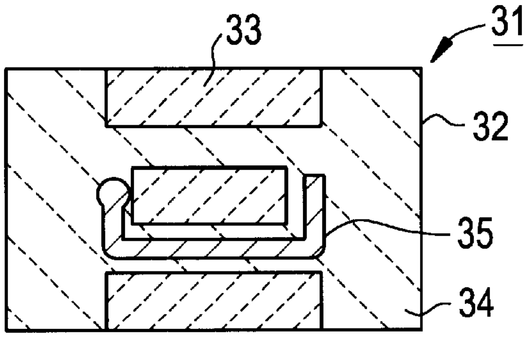
Figure 7C:
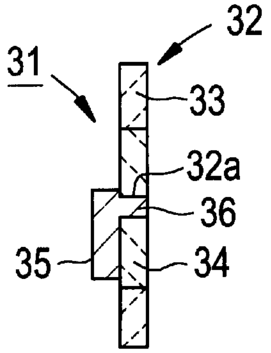

In the composite green sheet 32, a through hole is opened at a location where a via hole electrode is to be formed. A conductive paste is then printed on the top surface of the composite green sheet 32. During the printing operation, the conductive paste fills the through hole. As shown in FIGS. 7B and 7C, a conductor 35 is electrically connected to a via hole electrode 36 that fills the through hole 32*a.*

Figure 3F:
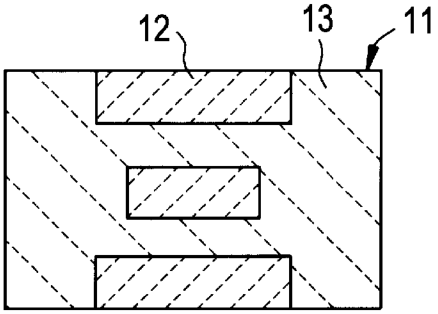
Figure 3D:
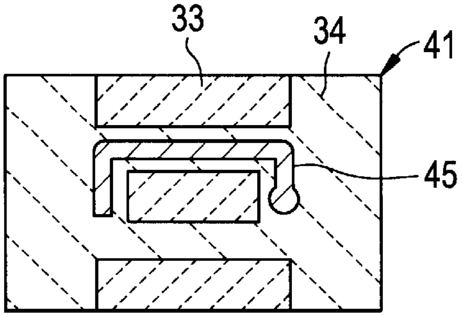

A conductor-attached composite green sheet 41 shown in FIG. 3D preferably has a construction similar to that of the conductor-attached composite green sheet 31. The conductor-attached composite green sheets 31 and 41 define one turn of coil with the conductors 35 and 45 connected. By repeatedly laminating the conductor-attached composite green sheets 31 and 41, a coil having a desired number of turns is produced.

A conductor-attached composite green sheet 51 shown in FIG. 3E has a conductor 52 having a bottom lead-out portion 9*b* at the end thereof in the same way as the conductor-attached composite green sheet 21. The conductor-attached composite green sheet 51 has the bottom end of the coil 9 without a via hole electrode.

A required number of composite green sheets 11 shown in FIG. 3F is laminated below the conductor-attached composite green sheet 51.

Figure 4A:
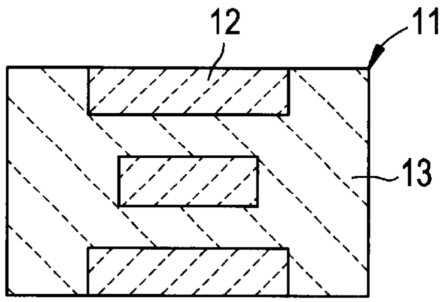
FIGS. 4A–4F are plan views diagrammatically illustrating composite green sheets prepared for the production of the laminated ceramic electronic component of the first preferred embodiment of the present invention.
Figure 4B:
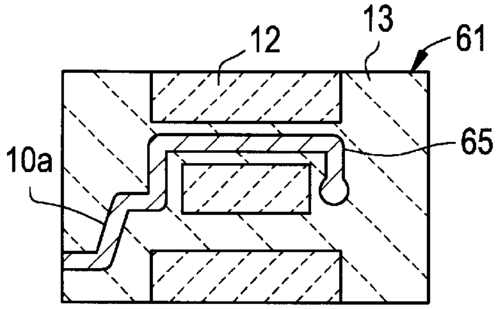
Figure 4E:
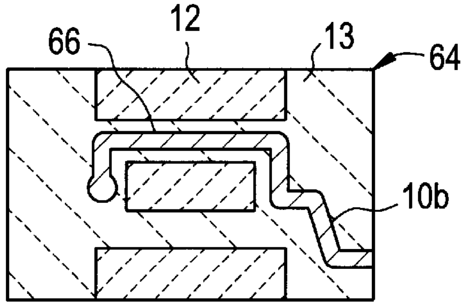
Figure 4C:
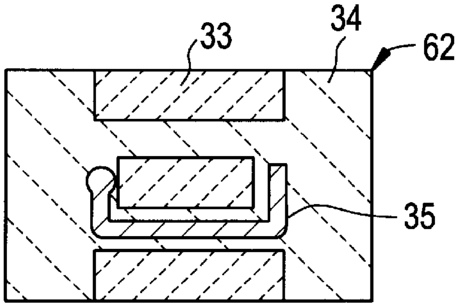

FIGS. 4A–4F are plan views diagrammatically illustrating composite green sheets accommodating the coil 10 arranged in the lower portion of the laminated ceramic electronic component 1. Referring to FIG. 4A, a composite green sheet 11 provided to isolate the coils 9 and 10 is laminated on the top of the lower portion. Laminated below the composite green sheet 11 are composite green sheets 61, 62, 63, 64, and the composite green sheet 11 respectively shown in FIG. 4B through FIG. 4F in that order. The conductor-attached composite green sheets 61 and 64, respectively corresponding to the conductor-attached composite green sheets 21 and 51 used in the first coil 9, have respectively conductors 65 and 66. The positions of the coil lead-out portions 10*a* and 10*b* are different from the positions of the coil lead-out portions 9*a* and 9*b* in the conductor-attached composite green sheets 21 and 51. The conductor-attached composite green sheets 62 and 63 have a construction similar to that of the conductor-attached composite green sheets 31 and 41.

To produce the laminated ceramic electronic component 1 of this preferred embodiment, composite green sheets shown in FIG. 3A through FIG. 4F are stacked into a laminate, and then a plurality of green sheets defining the external layers and made of a magnetic ceramic are stacked onto the laminate from above and from below. The resulting laminate structure is then pressed in the direction of thickness thereof, and is then sintered. The sintered ceramic body 2 shown in FIG. 1 is thus produced. The external electrodes 3 through 6 are disposed on the external surfaces of the sintered ceramic body 2. The laminated ceramic electronic component 1 is thus produced.

The lamination method of the composite green sheet will now be discussed, referring to FIG. 8A through FIG. 9B.

Figure 8A:
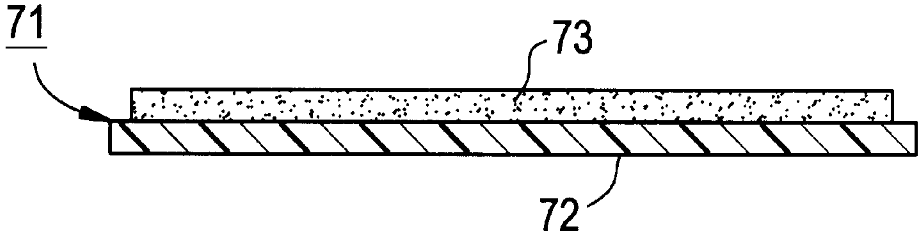
FIGS. 8A–8C are sectional views illustrating the transfer of a ceramic green sheet from a second transfer member in the first preferred embodiment of the present invention.

Referring to FIG. 8A, a second transfer member 71 is prepared to produce the bottom external layer. The second transfer member 71 includes a substantially rectangular magnetic ceramic green sheet 73 arranged on a second carrier film 72.

Figure 8B:
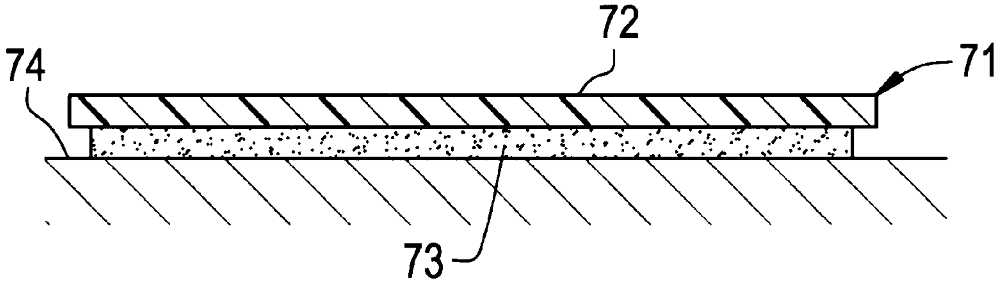

Referring to FIG. 8B, the second transfer member 71 is pressed with the side of the magnetic ceramic green sheet 73 against a flat lamination stage 74. The second carrier film 72 is then peeled off from the magnetic ceramic green sheet 73. In this way, the magnetic ceramic green sheet 73 is transferred to the lamination stage 74 from the second transfer member 71.

Figure 4F:
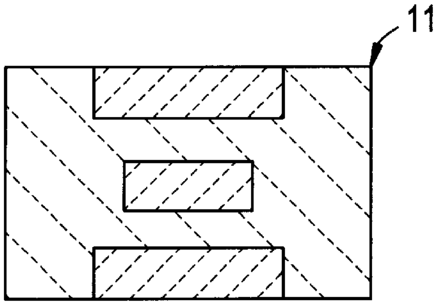
Figure 4D:
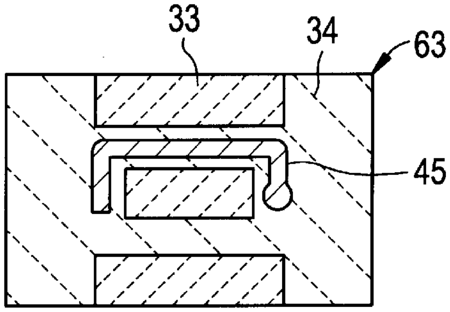
Figure 8C:
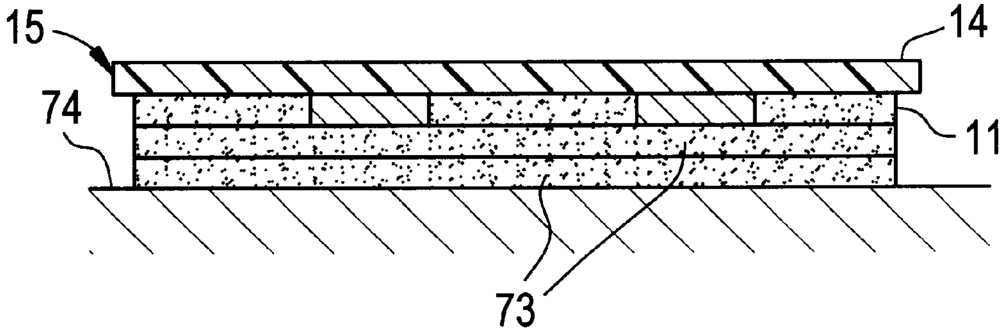

By repeating the above step, a plurality of magnetic ceramic green sheets 73 are laminated as shown in FIG. 8C. The composite green sheets 11 shown in FIG. 4F are laminated in the same transfer method. The composite green sheet 11 is supported on the carrier film 14, thereby forming the third transfer member 15. The third transfer member 15 is laminated with the composite green sheet 11 pressed onto the already laminated magnetic ceramic green sheet 73 as shown in FIG. 8C, and the carrier film 14 is peeled off. In this way, the composite green sheet 11 is transferred from the third transfer member 15.

Figure 9A:
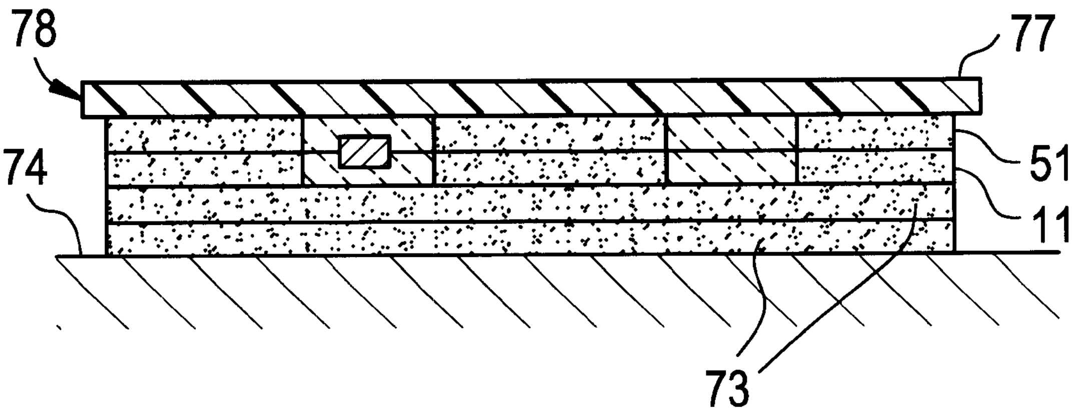
FIGS. 9A and 9B are sectional views illustrating steps for transferring the conductor-attached green sheet from the first transfer member in the first preferred embodiment of the present invention.
Figure 9B:
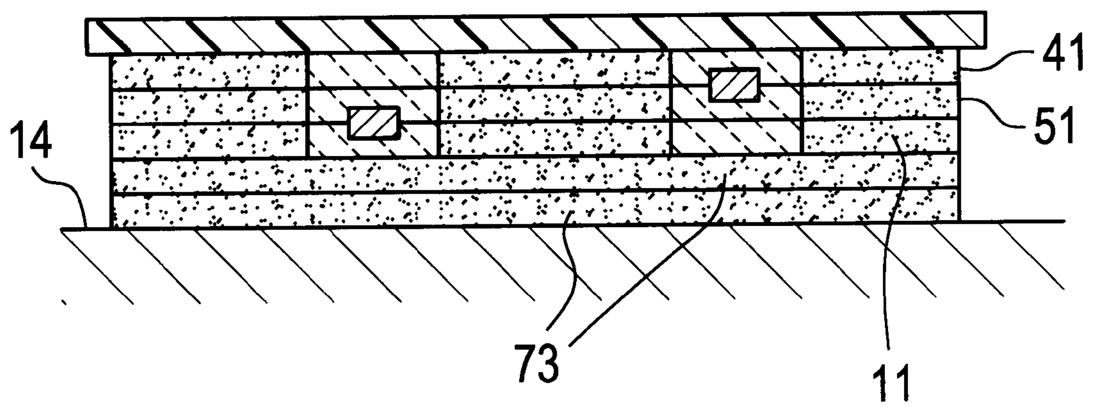

Referring to FIG. 9A, the conductor-attached composite green sheet 51 is laminated in the same transfer method. Specifically, a first transfer member 78 having a conductor-attached composite green sheet 51 supported by a first carrier film 77 is prepared. The first transfer member 78 is laminated with the conductor-attached composite green sheet 51 pressed on the already laminated composite green sheet 11. The first carrier film 77 is then peeled off. The conductor-attached composite green sheet 51 is laminated in this way. Referring to FIG. 9B, a conductor-attached composite green sheet 41 is also laminated through the same transfer method. Through these steps, a laminate for the above-referenced sintered ceramic body 2 is obtained.

In the manufacturing method of the laminated ceramic electronic component 1 of this embodiment, the transfer member having the composite green sheet or the conductor-attached composite green sheet supported on the carrier film is prepared. The composite green sheets and the conductor-attached composite green sheet are successively laminated. The laminate structure for the sintered ceramic body 2 is thus obtained.

Figure 10:
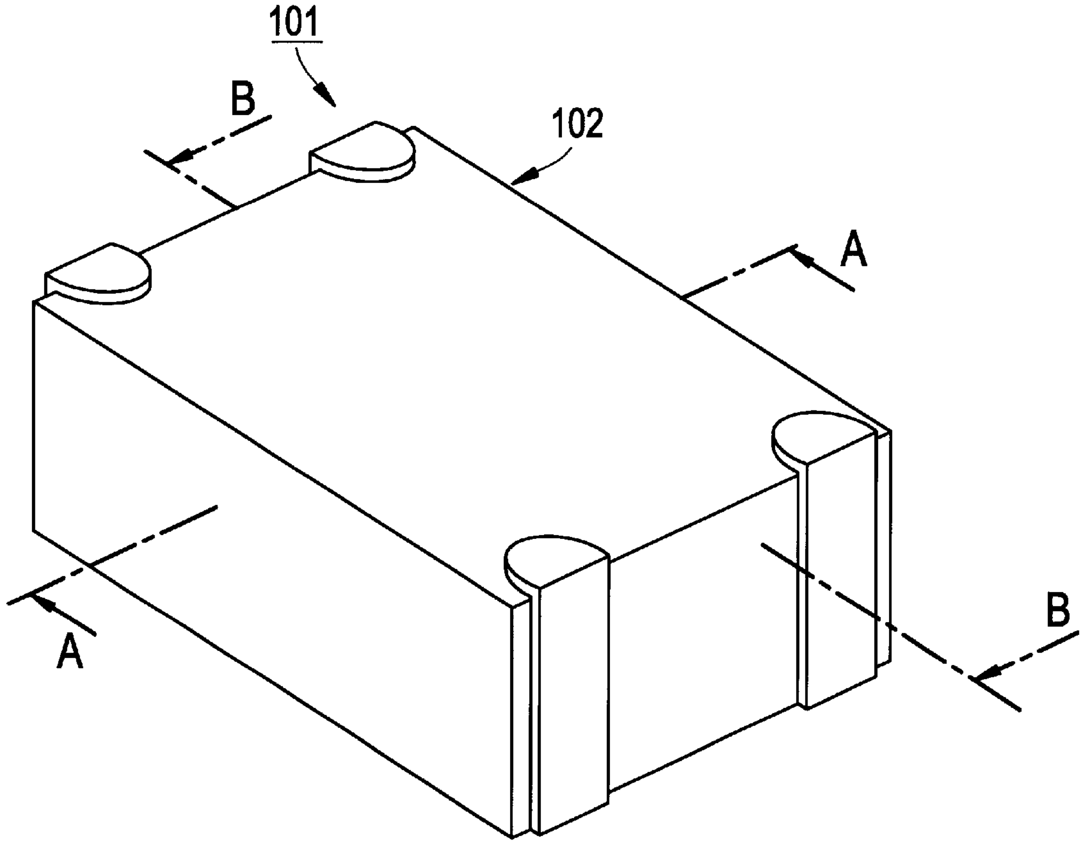
FIG. 10 is a perspective view showing a laminated ceramic electronic component of a second preferred embodiment of the present invention.
Figure 11A:
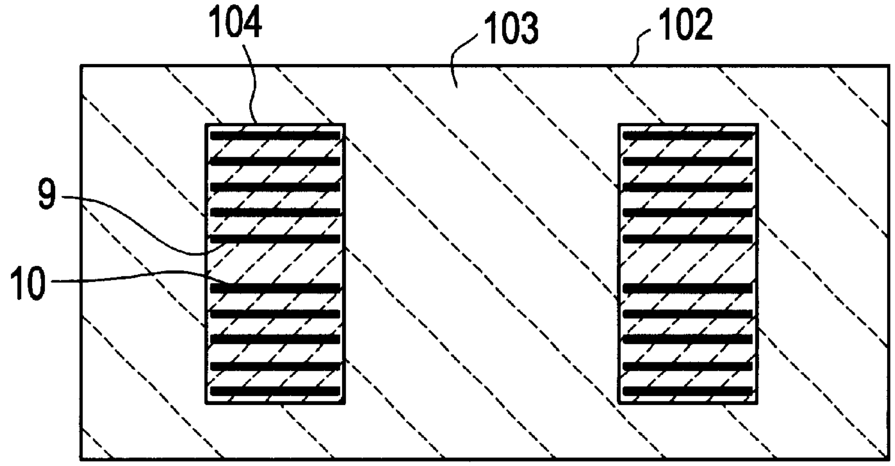
FIGS. 11A and 11B are sectional views of the laminated ceramic electronic component, respectively taken along line A—A and line B—B in FIG. 10.
Figure 11B:
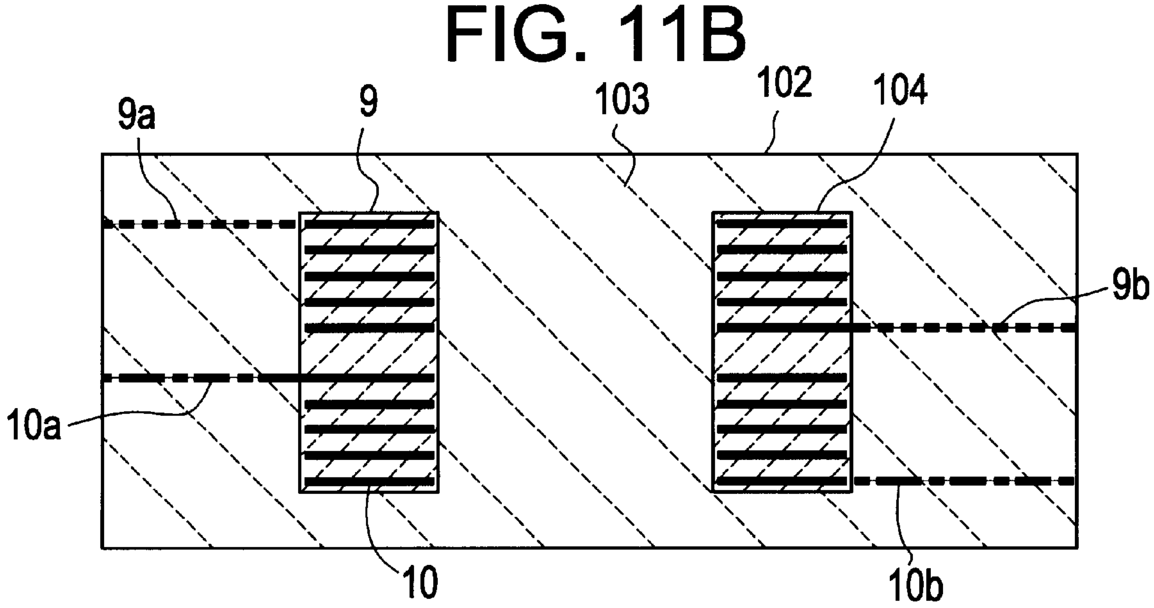

FIG. 10 is a perspective view showing a chip type monolithic common-mode choke coil as a laminated ceramic electronic component of a second preferred embodiment of the present invention. FIGS. 11A and 11B are sectional views of the laminated ceramic electronic component, respectively taken along line A—A and line B—B in FIG. 10.

A laminated ceramic electronic component 101 includes a sintered ceramic body 102. In the second preferred embodiment as well, first and second coils 9 and 10 are arranged in the top portion and the bottom portion of the sintered ceramic body 102. Similar to the sintered ceramic body 2, the sintered ceramic body 102 is constructed of a magnetic ceramic 103 and a non-magnetic ceramic 104. The coil portions of the coils 9 and 10 are enclosed in the non-magnetic ceramic 104.

The second preferred embodiment is different from the first preferred embodiment in that the non-magnetic ceramic 104 is provided in the regions of the coil portions of the coils 9 and 10, and is not provided in the regions of the lead-out portions 9*a*, 9*b*, 10*a*, and 10*b*. The rest of the laminated ceramic electronic component 101 of the second embodiment is preferably identical to that of the laminated ceramic electronic component 1 of the first preferred embodiment.

The sintered ceramic body 102 is produced by laminating sheets shown in FIGS. 12A–12D, FIGS. 13A and 13B, and FIGS. 14A–14D and by sintering the resulting laminate.

Figure 12A:
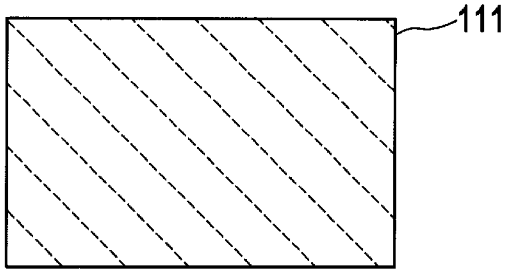
FIGS. 12A–12D are plan views showing green sheets that are laminated in the second preferred embodiment of the present invention.

External layers are provided in the top portion and the bottom portion of the laminated ceramic electronic component 101 by laminating a desired number of substantially rectangular magnetic ceramic green sheets 111 shown in FIG. 12A.

Figure 12B:
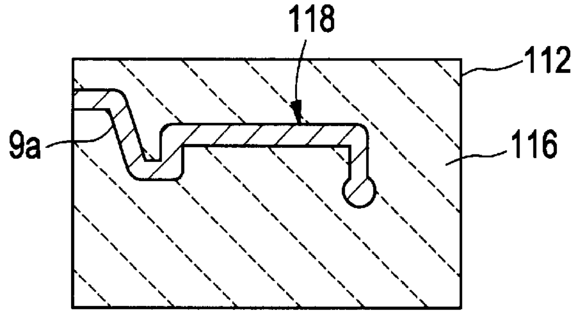
Figure 12C:
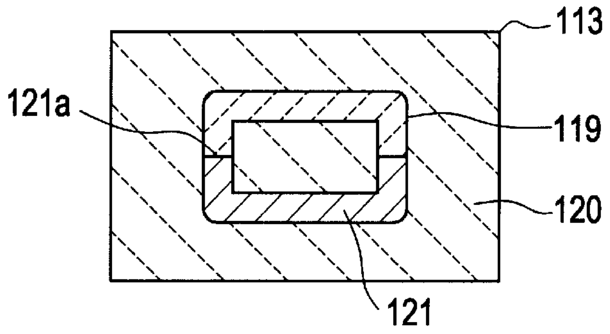
Figure 12D:
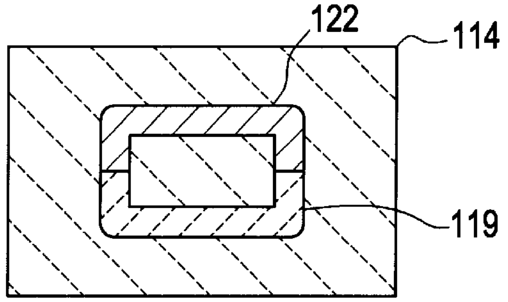

To produce the top coil 9, a conductor-attached green sheet 112 shown in FIG. 12B, a conductor-attached green sheet 113 shown in FIG. 12C, and a conductor-attached green sheet 114 shown in FIG. 12D are laminated in that order from top to bottom. The conductor-attached green sheet 112 includes a magnetic ceramic region 116 and a non-magnetic ceramic region. The non-magnetic ceramic region, although not shown in FIG. 12B, is formed below a conductor 118. A via hole electrode is arranged at the inner end of the conductor 118. The via hole electrode is formed by opening a through hole in the ceramic green sheet using a laser or through punching, and by filling the through hole with an electrically conductive paste preferably made of the same material as that of the conductor 118.

The conductor-attached green sheet 113 shown in FIG. 12C includes a substantially rectangular non-magnetic ceramic region 119 located at an area of the coil portion in a substantially rectangular frame outline and a magnetic ceramic region 120 located in the remaining area. A conductor 121 is formed by printing an electrically conductive paste in a half turn portion of the non-magnetic ceramic region 119 in the substantially rectangular frame outline. The conductor 121 has a via hole electrode at one end 121*a* thereof.

Like the conductor-attached green sheet 113, the conductor-attached green sheet 114 shown in FIG. 12D includes a substantially rectangular outline non-magnetic ceramic region 119. A conductor 122 is connected to the conductor 121, thereby forming one turn of the coil. The conductor 122 overlaps only the end of the conductor 121.

By laminating alternately conductor-attached green sheets 113 and 114, the coil 9 having a desired number of turns is produced.

Figure 13A:
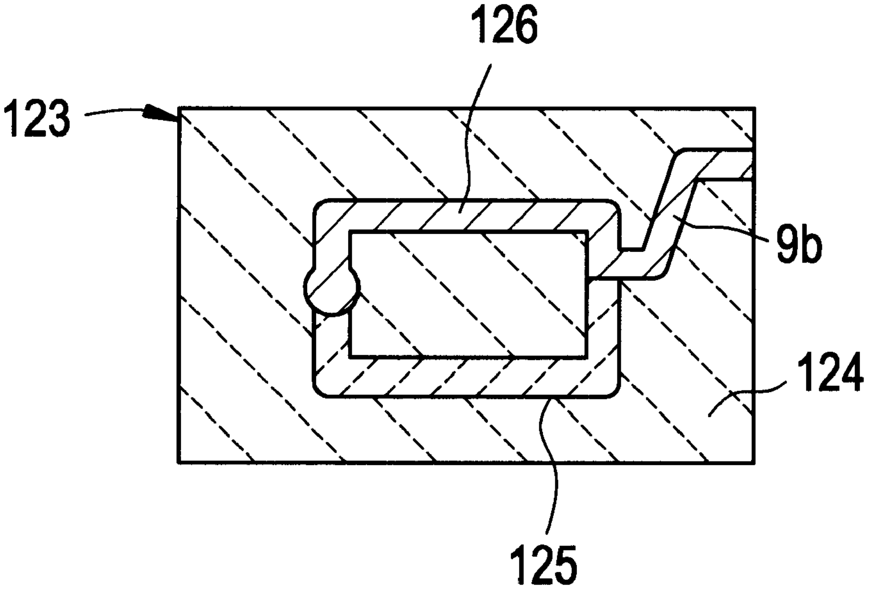
FIGS. 13A and 13B are plan views respectively showing a conductor-attached composite green sheet and a composite green sheet prepared in the second preferred embodiment of the present invention.

Arranged beneath the conductor-attached green sheet 114 is a composite green sheet 123 shown in FIG. 13A. The composite green sheet 123 preferably includes a substantially rectangularly outlined non-magnetic ceramic region 125 and a magnetic ceramic region 124 located in the remaining area of the composite green sheet 123. A conductor 126 having a coil lead-out portion 9*b* is printed to overlap the non-magnetic ceramic region 125 by a half turn. The inner end of the conductor 126 is electrically connected to a via hole electrode of the conductor-attached composite green sheet laminated above. The composite green sheet 123 thus has no via hole electrode.

Figure 13B:
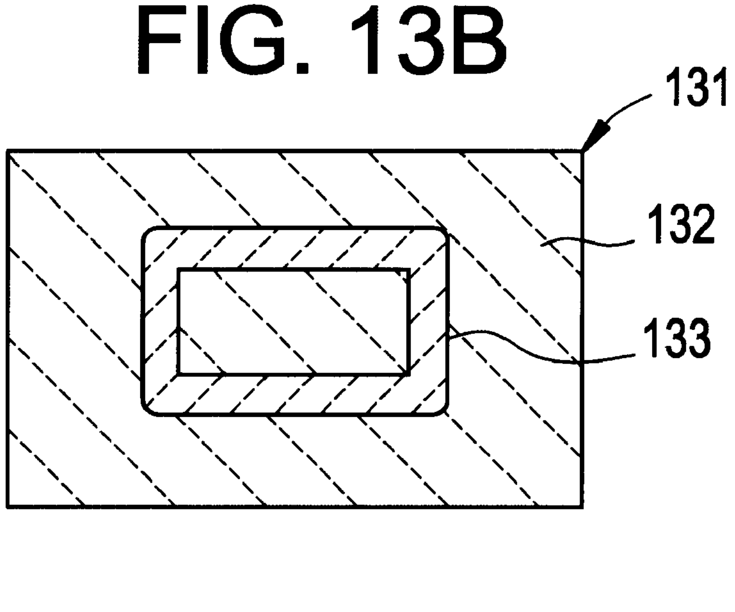

Arranged beneath the conductor-attached composite green sheet 123 are a desired number of composite green sheets 131 shown in FIG. 13B. The composite green sheet 131 includes a substantially rectangularly outlined non-magnetic ceramic region 133 and a magnetic ceramic region 132 located in the remaining area of the composite green sheet 131. The composite green sheet 131 is arranged to isolate the lower coil 10 from the upper coil 9.

FIGS. 14A–14D are plan views respectively showing composite green sheets used in a laminate forming a coil 10. A composite green sheet 141 has a construction that is preferably identical to that of the conductor-attached composite green sheet 123 except for the position of the coil lead-out portion thereof. Specifically, a conductor 142 has a lead-out portion 10*a* of the coil 10.

Figure 14A:
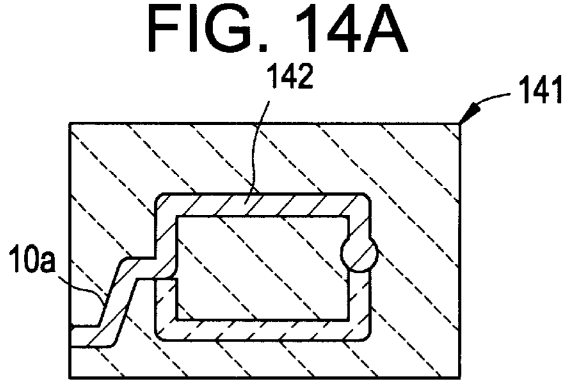
FIGS. 14A–14D are plan views respectively showing composite green sheets used in a laminate forming a second coil in the second preferred embodiment of the present invention.
Figure 14B:
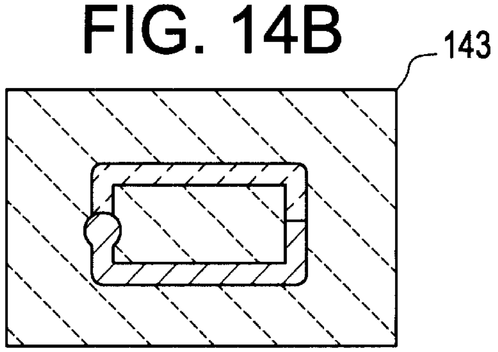
Figure 14C:
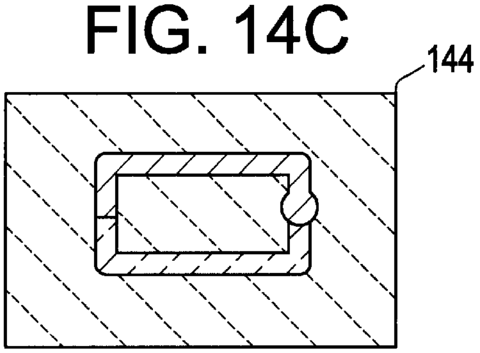
Figure 14D:
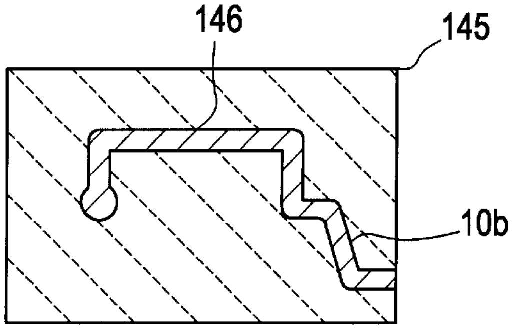
Figure 15:
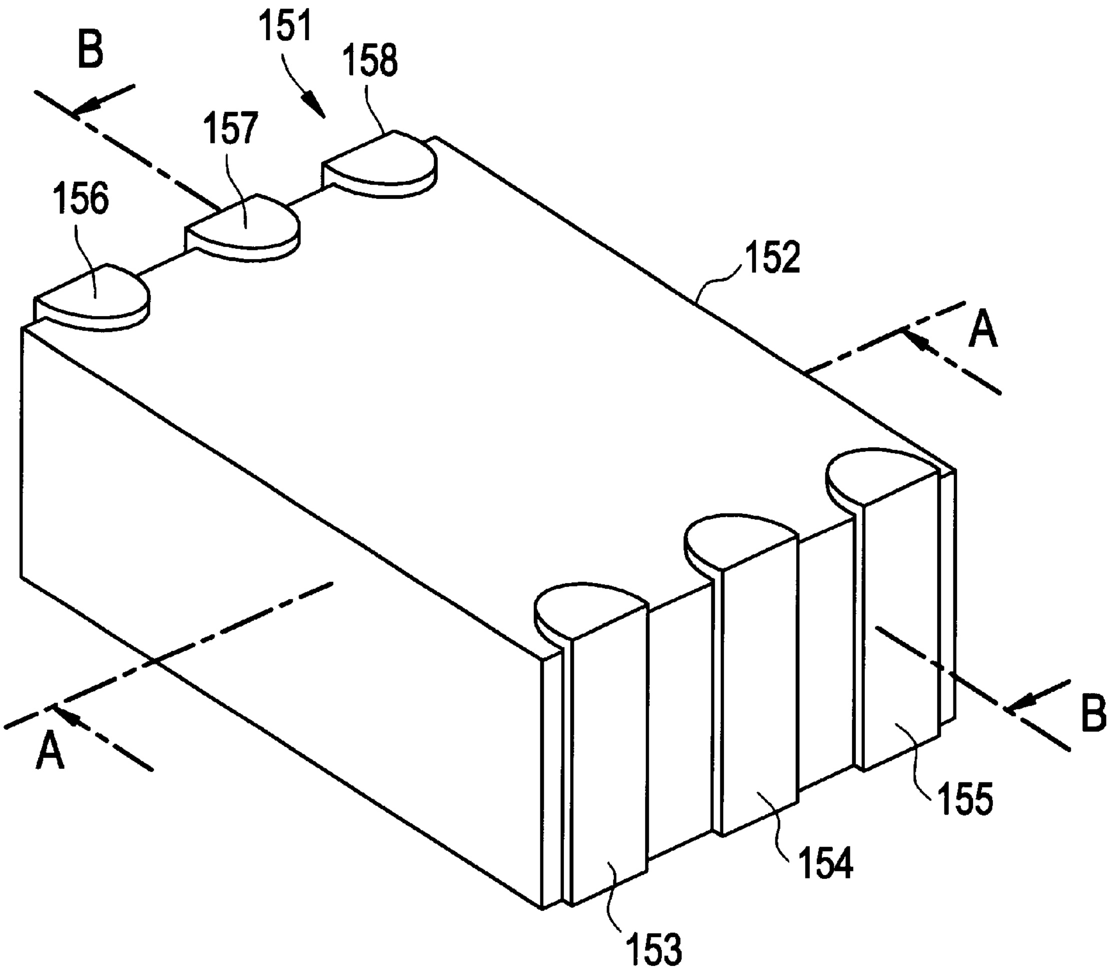
FIG. 15 is a perspective view showing a laminated ceramic electronic component of a modification of the second preferred embodiment of the present invention.

Conductor-attached composite green sheets 143 and 144 respectively shown in FIGS. 14B and 14C respectively preferably have the same constructions as those of the conductor-attached green sheets 113 and 114 forming the coil 9. A conductor-attached composite green sheet 145 shown in FIG. 14D has a construction that is substantially identical to that of the conductor-attached green sheet 112 arranged above the coil 9. Specifically, a conductor 146 has a lead-out portion 10*b* of the coil 10.

The above-described composite green sheets are laminated through the same transfer method described in connection with the first preferred embodiment, and the magnetic ceramic green sheets 111 are laminated above and below the laminate through the transfer method. The resulting laminate structure is pressed in the direction of thickness, and is then sintered. The sintered ceramic body 102 of the second preferred embodiment is thus produced.

Figure 16A:
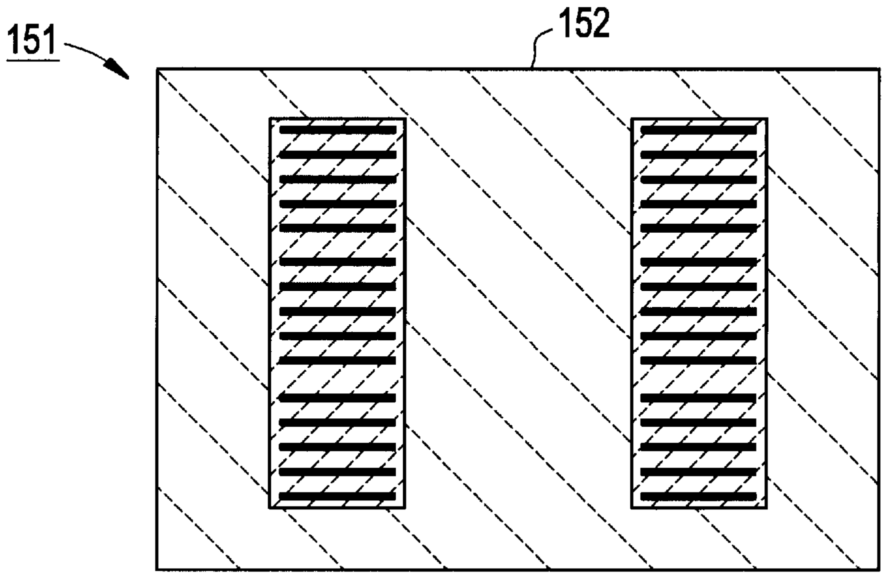
FIGS. 16A and 16B are sectional views of the modification of the second preferred embodiment, respectively taken along line A—A and line B—B in FIG. 15.
Figure 16B:
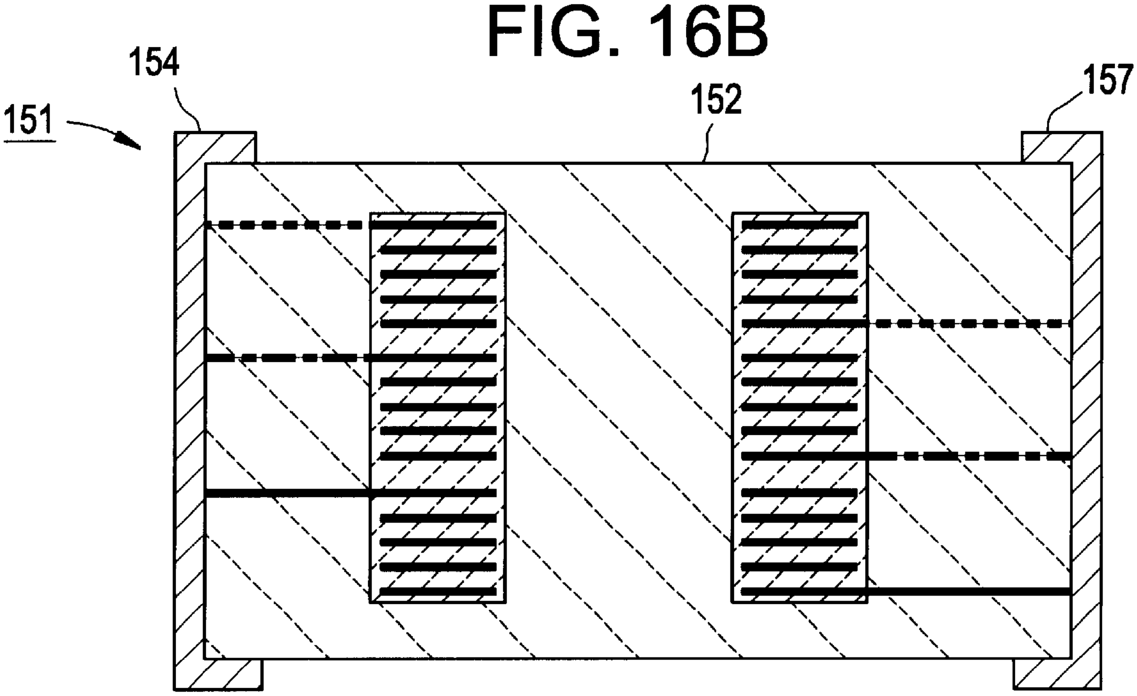

Each of the sintered ceramic bodies 2 and 102 of the first and second preferred embodiments is preferably provided with the four external electrodes. Alternatively, a laminated ceramic electronic component 151, as a modification of the first and second preferred embodiments, preferably includes six or more external electrodes 153–158 on the external surface of a sintered ceramic body 152. In this case, as shown in FIGS. 16A and 16B, the sintered ceramic body 152 includes three coils arranged in the direction of thickness in the same way as in the first and second preferred embodiments.

In the present invention, the number of coils and the number of internal electrodes, arranged within the sintered ceramic body, are not limited to any particular numbers.

Figure 17:
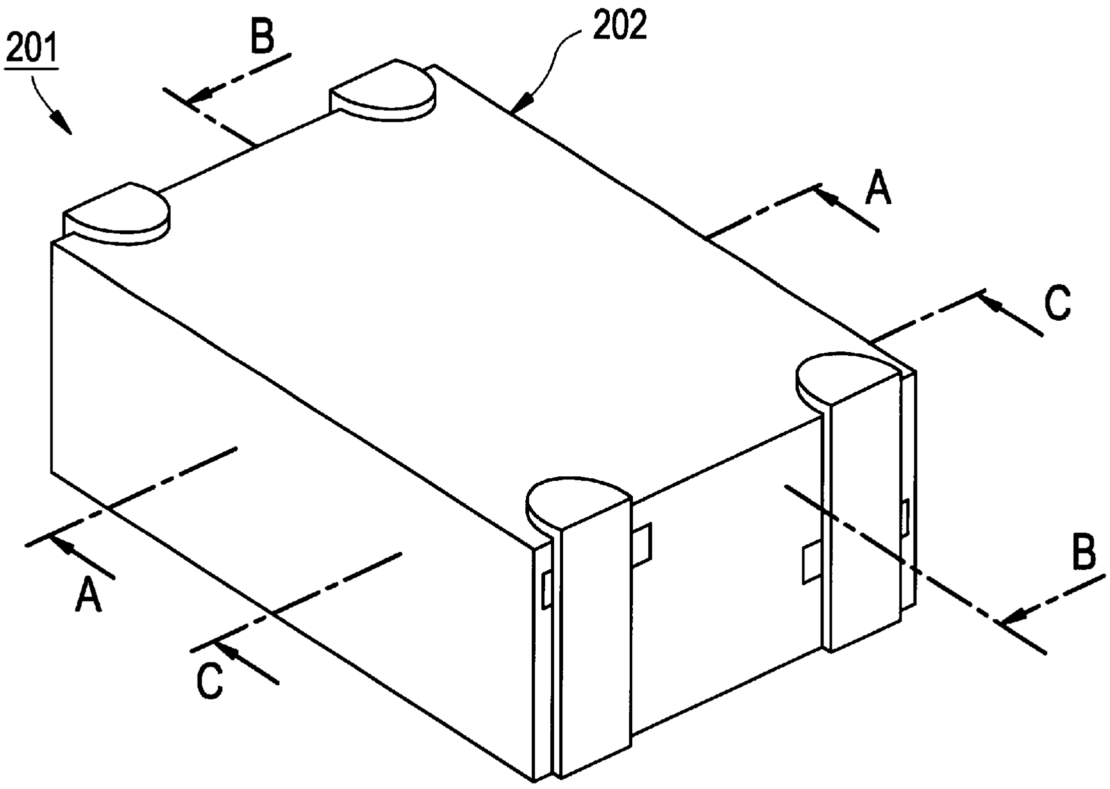
FIG. 17 is a perspective view showing a laminated ceramic electronic component of a third preferred embodiment of the present invention.
Figure 18A:
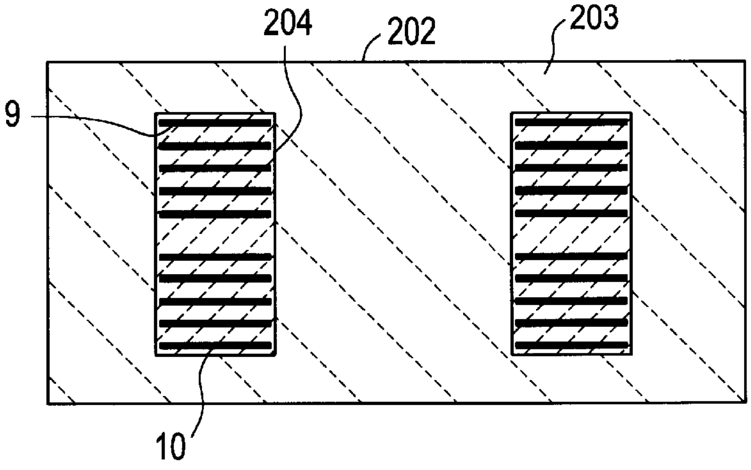
FIGS. 18A–18C are sectional views of the laminated ceramic electronic component, respectively taken along line A—A, line B—B, and line C—C in FIG. 17.
Figure 18B:
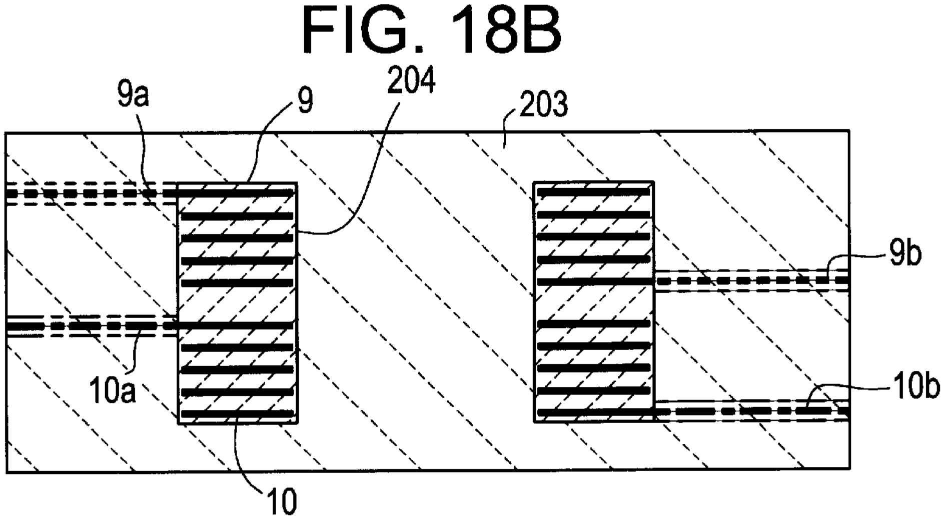
Figure 18C:
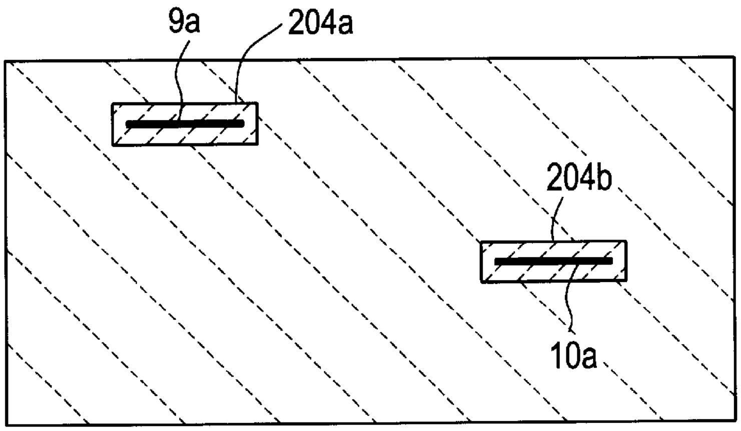

FIG. 17 is a perspective view showing the external appearance of a laminated ceramic electronic component 201 according to a third preferred embodiment of the present invention. FIGS. 18A–18C are sectional views of the laminated ceramic electronic component 201, respectively taken along line A—A, line B—B, and line C—C in FIG. 17. As in the first and second preferred embodiments, in the laminated ceramic electronic component 201 of the third preferred embodiment, a sintered ceramic body 202 is preferably made of a magnetic ceramic 203 and a non-magnetic ceramic 204. The sintered ceramic body 202 accommodates first and second coils 9 and 10 therein. The coil 9 includes a coil portion where a conductor thereof is coiled, and first and second lead-out portions 9*a* and 9*b*. The coil 10 also includes a coil portion where a conductor thereof is coiled, and first and second lead-out portions 10*a* and 10*b*. The non-magnetic ceramic 204 is different from its counterpart in the second preferred embodiment. In the laminated ceramic electronic component 1 of the second preferred embodiment, non-magnetic ceramic layers are not provided above and below each of the coil lead-out portions 9*a* and 9*b* of the coil 9 and the coil lead-out portions 10*a* and 10*b* of the coil 10. In the third preferred embodiment, each of the coil lead-out portions 9*a* and 10*a* is sandwiched between non-magnetic ceramic layers 204*a* and each of the coil lead-out portions 9*b* and 10*b* is sandwiched between non-magnetic ceramic layers 204*b*. The rest of the construction of the third preferred embodiment is preferably the same as that of the second preferred embodiment. Like components are designated with like reference numerals, and repetitious discussion of these elements is omitted.

By enclosing the coil lead-out portions 9*a*, 9*b*, 10*a*, and 10*b* in the non-magnetic ceramic layers 204*a* and 204*b*, normal impedance is reduced.

Since the coil lead-out portions 9*a*, 9*b*, 10*a*, and 10*b* are also enclosed in the non-magnetic ceramic in the first preferred embodiment, the first preferred embodiment also provides the advantage of a low normal impedance.

Figure 19:
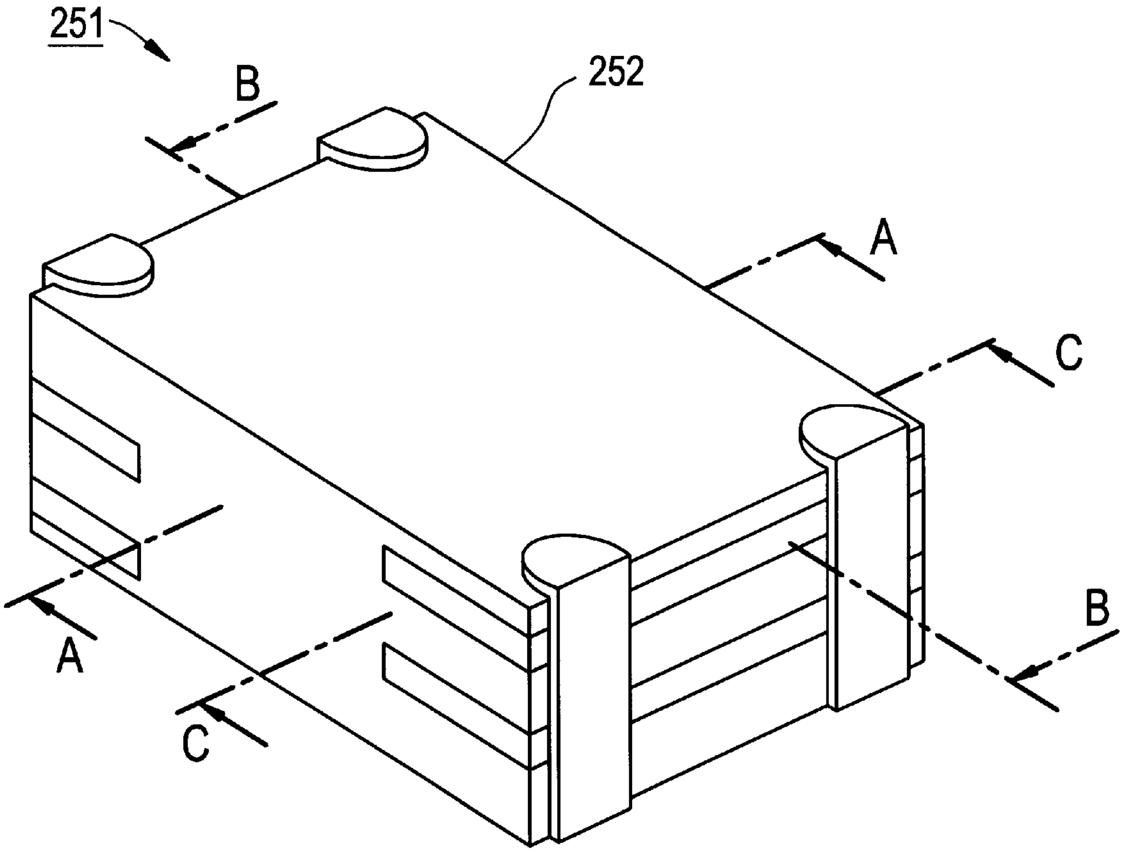
FIG. 19 is a perspective view showing the external appearance of a laminated ceramic electronic component of a fourth preferred embodiment of the present invention.
Figure 20A:
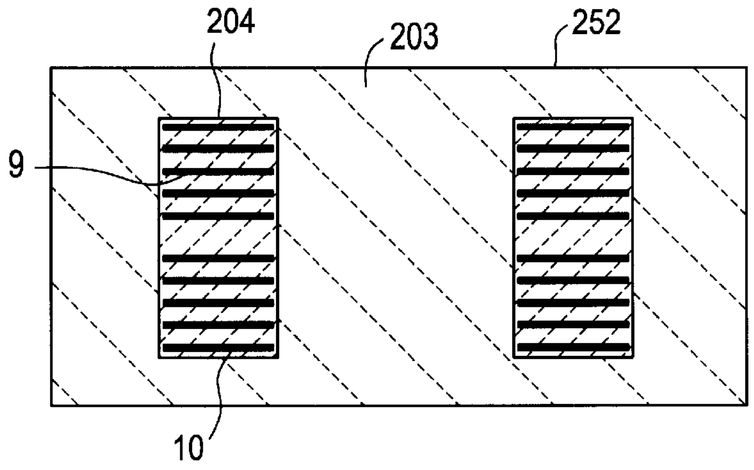
FIGS. 20A–20C are sectional views of the laminated ceramic electronic component, respectively taken along line A—A, line B—B, and line C—C in FIG. 19.
Figure 20B:
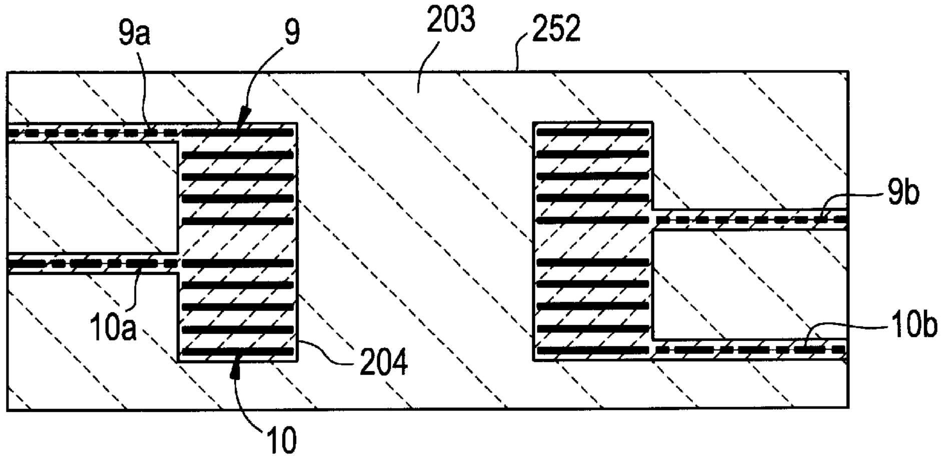
Figure 20C:
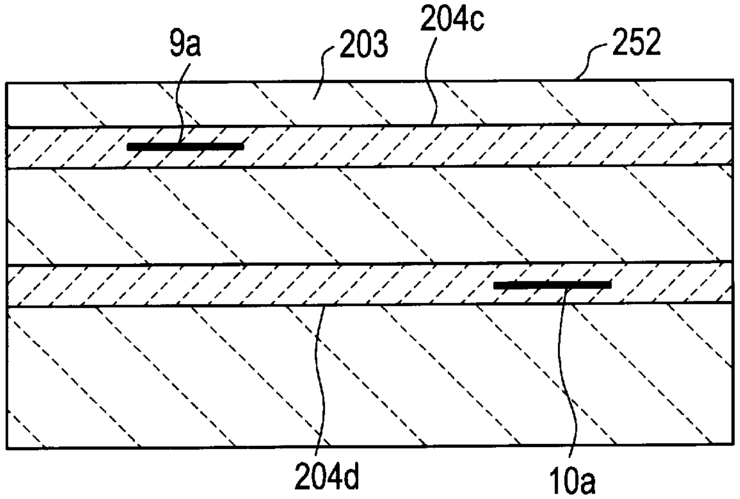

FIG. 19 is a perspective view showing the external appearance of a laminated ceramic electronic component 251 of a fourth preferred embodiment of the present invention, and FIGS. 20A–20C are sectional views of the laminated ceramic electronic component, respectively taken along line A—A, line B—B, and line C—C in FIG. 19.

As in the third preferred embodiment, the laminated ceramic electronic component 251 of the fourth preferred embodiment includes coil lead-out portions 9*a* and 9*b* of a coil 9 and coil lead-out portions 10*a* and 10*b* of a coil 10 enclosed in non-magnetic ceramic layers 204*c* and 204*d*. As seen from FIG. 20C, the non-magnetic ceramic layers 204*c* and 204*d* enclosing the coil lead-out portions 9*a* and 10*a* extend along the full width of a sintered ceramic body 252 at respective levels. In the third preferred embodiment, a portion surrounding the coil lead-out portions 9*a* and 10*a* is formed of the non-magnetic ceramic layers 204*a* and 204*b*. In the fourth preferred embodiment, the non-magnetic ceramic layers 204*c* and 204*d* extend along the full width of the sintered ceramic body 252 in the coil lead regions.

Figure 21:
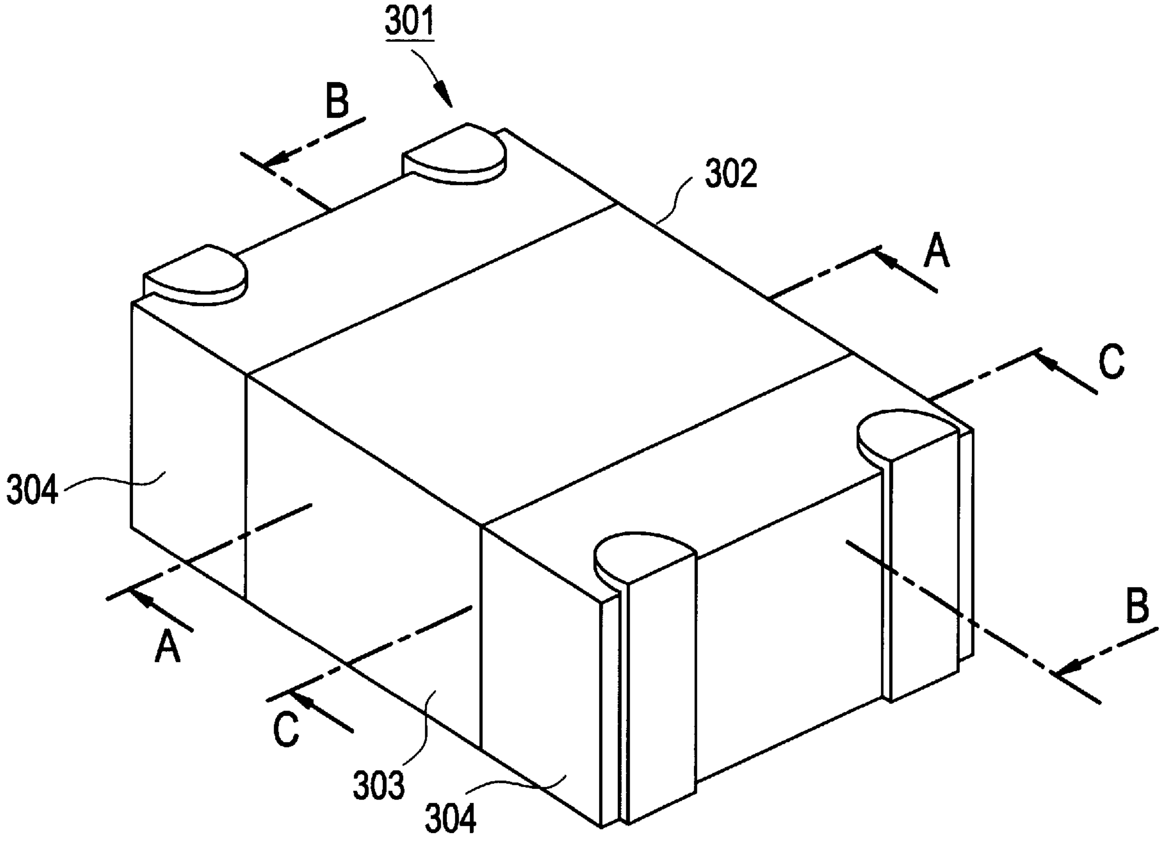
FIG. 21 is a perspective view showing the external appearance of a laminated ceramic electronic component of a fifth preferred embodiment of the present invention.
Figure 22A:
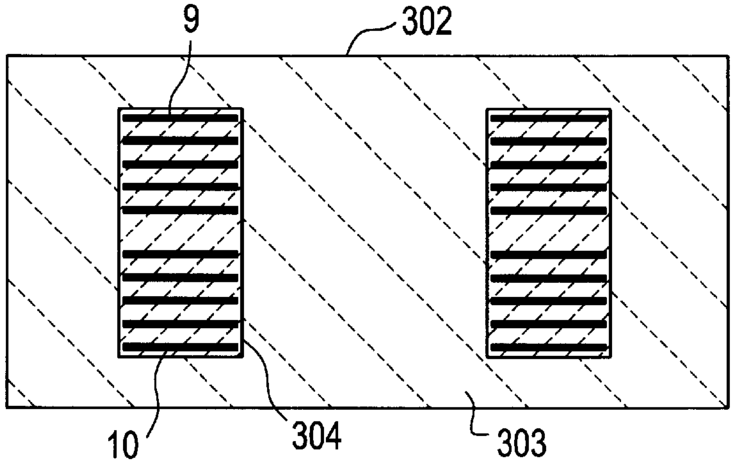
FIGS. 22A–22C are sectional views of the laminated ceramic electronic component, respectively taken along line A—A, line B—B, and line C—C in FIG. 21.
Figure 22B:
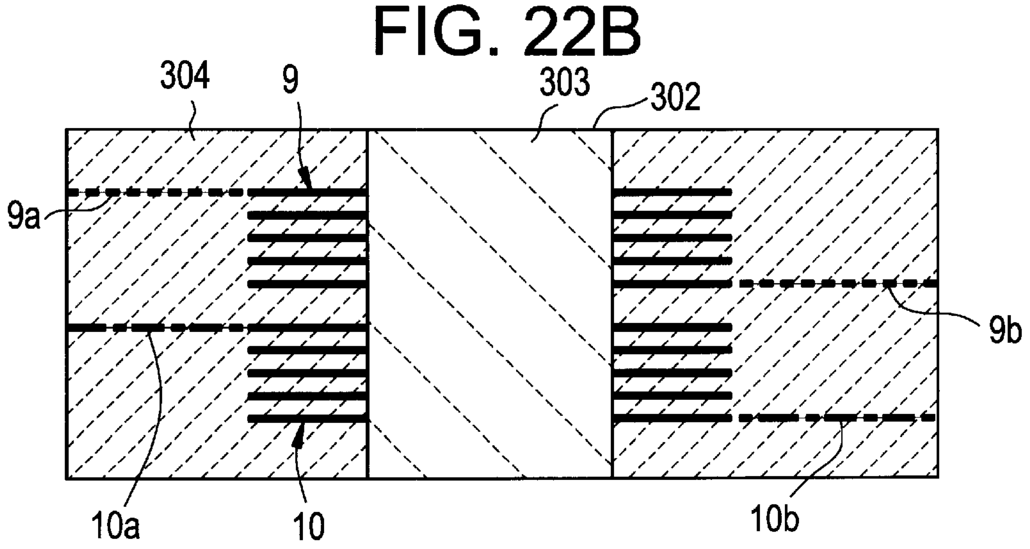
Figure 22C:
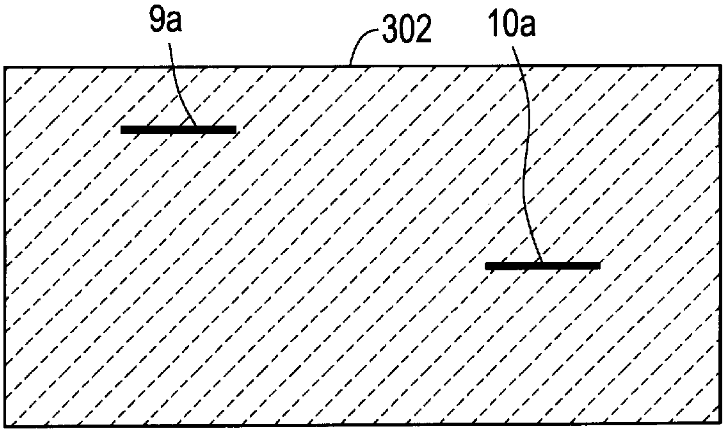

FIG. 21 is a perspective view showing the external appearance of a laminated ceramic electronic component 301 of a fifth preferred embodiment of the present invention, and FIGS. 22A–22C are sectional views of the laminated ceramic electronic component, respectively taken along line A—A, line B—B, and line C—C in FIG. 21.

Referring to FIG. 22A, in the laminated ceramic electronic component 301 of the fifth preferred embodiment, a sintered ceramic body 302 preferably includes a magnetic ceramic 303 and non-magnetic ceramics 304. The non-magnetic ceramics 304 extend outwardly from the coil portions of the coils 9 and 10 in the longitudinal direction of the sintered ceramic body 302. In other words, the sintered ceramic body 302 includes the magnetic ceramic 303 in the center thereof, and the non-magnetic ceramics 304 in both longitudinal end portions thereof. The non-magnetic ceramics 304 inwardly extend from the longitudinal end portions of the sintered ceramic body 302 to cover the coil portions of the coils 9 and 10. Therefore, the coil lead-out portions 9*a,* 9*b,* 10*a,* and 10*b* of the coils 9 and 10 are enclosed in the non-magnetic ceramics 304. The longitudinal end portions of the sintered ceramic body 302 are thus fully formed of the non-magnetic ceramics 304. The rest of the construction of the fifth preferred embodiment is substantially the same as that of the second preferred embodiment.

Since the non-magnetic ceramics 304 fully coat the coil lead-out portions 9*a,* 9*b,* 10*a,* and 10*b* in the laminated ceramic electronic component 301 of the fifth preferred embodiment, high-frequency characteristics and normal impedance of the laminated ceramic electronic component 301 are greatly improved.

Figure 23:
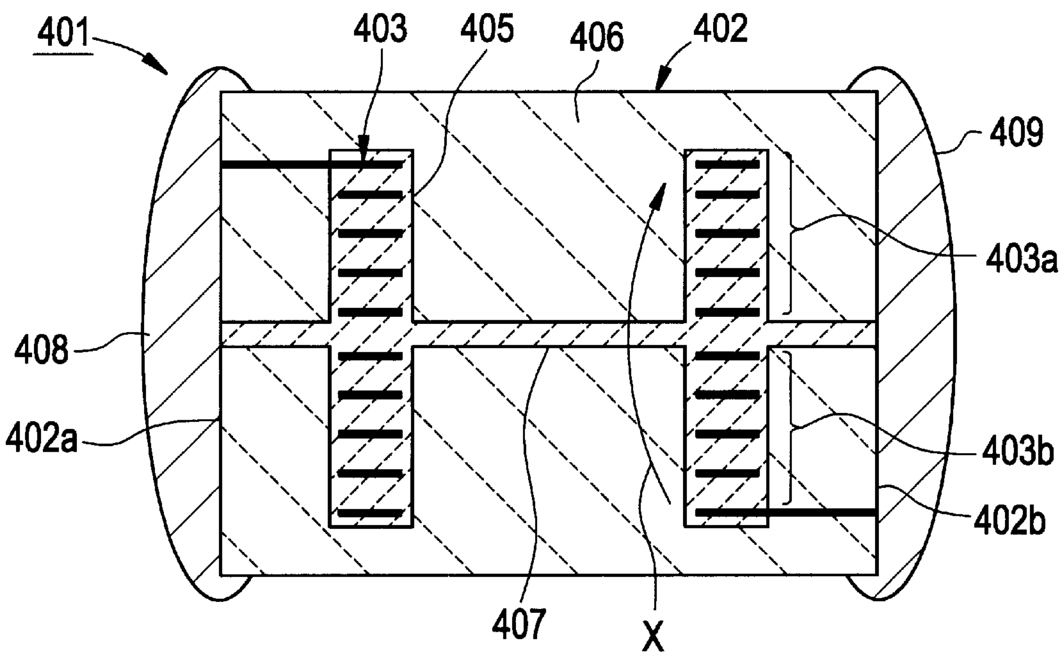
FIG. 23 is an elevational sectional view of a laminated ceramic electronic component of a sixth preferred embodiment of the present invention.

FIG. 23 is an elevational sectional view of a laminated ceramic electronic component 401 of a sixth preferred embodiment of the present invention.

In the laminated ceramic electronic component 401, a sintered ceramic body 402 includes a coil 403. The top end of the coil 403 is routed out to an end surface 402*a* of the sintered ceramic body 402, while the bottom end of the coil 403 is routed out to the other end surface 402*b*. As in the first preferred embodiment through fifth preferred embodiment, the coil 403 is enclosed in the non-magnetic ceramic 405, and the remaining portion of the laminated ceramic electronic component 401 is made of a magnetic ceramic 406. A non-magnetic ceramic layer 407 fully horizontally extends at a level within the sintered ceramic body 402 between an upper portion 403*a* and a lower portion 403*b* of the coil 403.

External electrodes 408 and 409 are arranged, respectively, to cover end surfaces 402*a* and 402*b*. The external electrodes 408 and 409 are electrically connected to the top end and the bottom end of the coil 403. The laminated ceramic electronic component 401 of the sixth preferred embodiment is also manufactured preferably in the same manner as those of the first through fifth preferred embodiments. Specifically, the conductor-attached composite green sheets are laminated through the transfer method, the magnetic green sheets are stacked onto the laminate from above and below, and the resulting laminate structure is then sintered. Like the laminated ceramic electronic component 1 of the first preferred embodiment, the laminated ceramic electronic component 401 of the sixth preferred embodiment is manufactured through relatively simple steps at low costs, compared with conventional monolithic inductors. When the conductor is printed, printing accuracy of the electrically conductive paste is high because the top surface of the composite green sheet is flat.

Since the laminated ceramic electronic component 401 of the sixth preferred embodiment includes the non-magnetic ceramic layer 407 located between the top portion 403*a* and the bottom portion 403*b* of the coil 403, an open magnetic circuit type inductor is provided. The generation of a magnetic flux between coil conductors at each level of the coil 403 is controlled. Furthermore, the generation of a magnetic flux running between the top portion 403*a* and the bottom portion 403*b* is controlled. This arrangement results in a monolithic inductor that is excellent in current superimposition characteristics and is much less susceptible to a reduction in inductance value.

Figure 24:
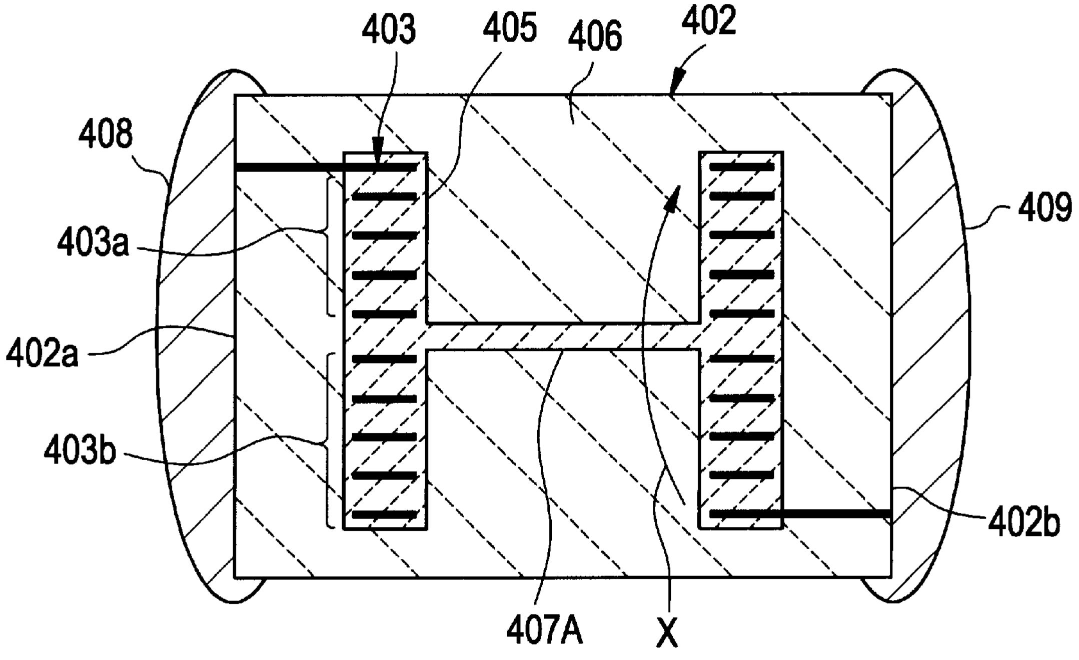
FIG. 24 is an elevation sectional view of a modification of the laminated ceramic electronic component of the sixth preferred embodiment shown in FIG. 23.

FIG. 24 is an elevation sectional view of a modification of the laminated ceramic electronic component 401 of the sixth preferred embodiment shown in FIG. 23. The laminated ceramic electronic component 401 includes the non-magnetic ceramic layer 407 fully extending along the horizontal section at a middle level within the sintered ceramic body 402. As shown in FIG. 24, a non-magnetic ceramic layer 407A extends only within a region in which a coil 403 is wound. In this case, an open magnetic circuit type inductor results.

Figure 25:
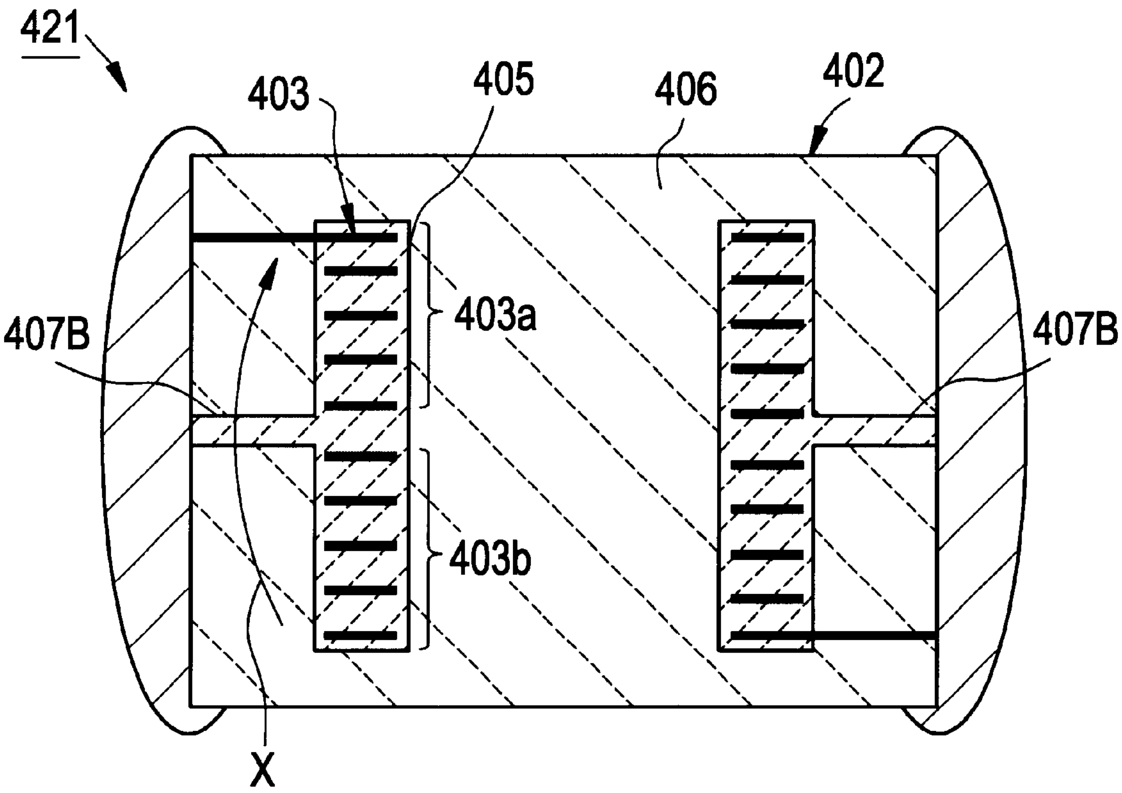
FIG. 25 is an elevational sectional view of another modification of the laminated ceramic electronic component of the sixth preferred embodiment shown in FIG. 23.

FIG. 25 is an elevational sectional view showing yet another modification of the laminated ceramic electronic component 401. In a laminated inductor 421 shown in FIG. 25, a non-magnetic ceramic layer 407B is arranged externally relative to a region in which a coil 403 is wound. In this case as well, an open magnetic circuit type inductor results.

To control a large magnetic flux running between the top and bottom portions 403*a* and 403*b* of the coil, each of the non-magnetic ceramic layers 407, 407A, and 407B is arranged in a place where the magnetic flux needs to be blocked. The position of the non-magnetic ceramic layer is not limited to specific preferred embodiments and the modifications thereof described above.

In accordance with the method of various preferred embodiments of the present invention of manufacturing the laminated ceramic electronic component, the first and second transfer members are prepared, and are subjected to the first through third transfer steps. The laminated ceramic body is thus produced. Compared with the lamination-by-printing method that repeats printing, the steps are simplified, and costs of the laminated ceramic electronic component are greatly reduced.

In the lamination-by-printing method, the flatness of the surface of the underlayer is not sufficient, and the pastes run and migrate. The ceramic component suffers from variations in performance. In accordance with various preferred embodiments of the present invention, the underlayer on which the conductor is printed is flat. Since the conductor-attached composite green sheets and the ceramic green sheet are laminated through the transfer method. A laminated ceramic electronic component that is reliable and suffers from less performance variations is thus provided.

The via hole electrode is formed in the composite ceramic green sheet in at least one first transfer member to connect the conductors of the conductor-attached composite green sheets. A plurality of conductors are electrically connected through the via holes. A coil conductor functioning as an inductor is thus easily produced.

The first ceramic region is preferably made of the magnetic ceramic, and the second ceramic region is preferably made of the non-magnetic ceramic. By arranging a conductor forming a coil in the non-magnetic ceramic region, an open magnetic circuit type laminated coil is easily provided.

When the ceramic green sheet of the second transfer member is made of the magnetic ceramic, the top and bottom external layers of the laminated ceramic electronic component are preferably made of the magnetic ceramic.

The first ceramic region and the second ceramic region are formed by respectively printing the magnetic ceramic paste and the non-magnetic ceramic paste. Since the first and second ceramic regions do not overlap each other, a composite ceramic green sheet having a flat top surface is easily produced.

The via hole electrode is produced by keeping the first and second ceramic regions out of a via hole electrode formation area when the composite ceramic green sheet is produced, and then by filling the via hole electrode formation area with an electrically conductive paste. In this way, the via hole electrode having a highly reliable electrical connection is provided.

The via hole electrode is produced by opening a through hole in a via hole electrode formation area subsequent to the production of the composite ceramic green sheet, and then by filling the through hole with an electrically conductive paste. The via hole electrode formation step is simplified. Since the filling step of filling the through hole with the electrically conductive paste is performed concurrently together with the printing step of printing the conductor, the steps are substantially simplified.

When the ceramic green sheet of the second transfer member is produced by forming the ceramic green sheet on the second carrier film, a known ceramic green sheet formation technique such as a doctor blading technique may be used.

The third transfer member that includes the composite ceramic green, and the third carrier film supporting the composite ceramic green sheet, is prepared. The composite ceramic green sheet is transferred from at least one third transfer member between the first transfer step and the third transfer step. One of the first ceramic region and the second ceramic region is formed to be in contact with the conductor such as the coil from above or below.

The laminated ceramic electronic component of other preferred embodiments of the present invention is produced by the manufacturing method of the above-described preferred embodiments of the present invention of the laminated ceramic electronic component. In the laminated ceramic electronic component having the first and second ceramic regions in the sintered ceramic body, the laminated ceramic electronic component having a variety of functions such as an open magnetic circuit type laminated coil may be produced by selecting the materials of the first and second ceramic regions.

In the laminated ceramic electronic component according to preferred embodiments of the present invention, not only the coil portion of the coil but also the first and second coil lead-out portions are encapsulated in the non-magnetic ceramic. When the component is used as a monolithic inductor, normal impedance thereof is greatly reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a laminated ceramic electronic component comprising steps of:

preparing a plurality of first transfer members which include a conductor-attached composite green sheet and a first carrier film supporting the composite green sheet, wherein said conductor-attached composite green sheet includes a composite ceramic green sheet, having a first ceramic region and a second ceramic region made of a ceramic that is different from a ceramic of the first ceramic region, and a conductor attached on one surface of the composite ceramic green sheet;

preparing a plurality of second transfer members which include a ceramic green sheet and a second carrier film supporting the ceramic green sheet;

preparing a plurality of third transfer members which includes a composite green sheet including a first ceramic region and a second ceramic region;

a first transfer step of transferring the ceramic green sheet of at least one of said plurality of second transfer members on a lamination stage;

a second transfer step of transferring the conductor-attached composite green sheet of at least one of said plurality of first transfer members and transferring the composite green sheet of at least one of said plurality of third transfer members to at least one ceramic green sheet that has been already laminated;

a third transfer step of transferring the ceramic green sheet of at least one of said plurality of second transfer members to the conductor-attached composite green sheet that has been already laminated; and sintering a laminated body obtained from the first, second and third transfer steps; wherein the first ceramic region of the conductor-attached composite green sheet of the plurality of first transfer members and of the composite green sheet of the plurality of third transfer members are formed by printing a magnetic ceramic paste and the second ceramic region of the conductor-attached composite green sheet of the plurality of first transfer members and of the composite green sheet of the plurality of third transfer members are formed by printing a non-magnetic ceramic paste; and during the second transfer step, the conductor-attached composite preen sheet of at least one of said plurality of first transfer members and the composite green sheet of at least one of said plurality of third transfer members are transferred such that a conductor of the conductor-attached composite green sheet is partially embedded in the non-magnetic ceramic paste of the conductor-attached composite green sheet of at least one of said plurality of first transfer members and partially embedded in the non magnetic ceramic paste of the composite green sheet of at least one of said plurality of third transfer members.

2. A method for manufacturing a laminated ceramic electronic component according to claim 1 further comprising the steps of:

preparing a plurality of first transfer members; and forming a via hole electrode in the composite ceramic green sheet of the conductor-attached composite green sheet of at least one of the plurality of first transfer members so that the conductors are connected among a plurality of conductor-attached composite green sheets subsequent to lamination.

3. A method for manufacturing a laminated ceramic electronic component according to claim 2, wherein a plurality of conductors are connected through the via hole electrodes to form a coil conductor when the plurality of conductor-attached composite green sheets are laminated.

4. A method for manufacturing a laminated ceramic electronic component according to claim 2, further comprising the steps of:

forming the first and second ceramic regions except at a location where a via hole electrode is to be formed; and thereafter filling the region with an electrically conductive paste to form the via hole electrode.

5. A method for manufacturing a laminated ceramic electronic component according to claim 2, further comprising the steps of:

forming a through hole in which a via hole electrode is to be formed after preparing the composite ceramic green sheet; and filling the through hole with an electrically conductive paste to form the via hole electrode.

6. A method for manufacturing a laminated ceramic electronic component according to claim 1, wherein the ceramic green sheet of the second transfer member is made of a magnetic ceramic.

7. A method for manufacturing a laminated ceramic electronic component according to claim 1, wherein the conductor is formed on the top surface of the composite green sheet in the first transfer member.

8. A method for manufacturing a laminated ceramic electronic component according to claim 1, wherein the conductor is formed on the bottom surface of the composite green sheet in the first transfer member.

9. A method for manufacturing a laminated ceramic electronic component according to claim 1, wherein the ceramic green sheet of the second transfer member is produced by forming a ceramic green sheet on the second carrier film.

10. A method of manufacturing a laminated ceramic electronic component according to claim 1, wherein the laminated ceramic electronic component is a closed magnetic circuit type laminated common mode choke coil.

11. A method of manufacturing a laminated ceramic electronic component according to claim 1, wherein the laminated ceramic electronic component is an open magnetic circuit type laminated common mode choke coil.

* * * * *